(12) United States Patent
Craig et al.

(10) Patent No.: US 6,919,225 B2
(45) Date of Patent: Jul. 19, 2005

(54) METHODS AND APPARATUSES RELATING TO BLOCK CONFIGURATIONS AND FLUIDIC SELF-ASSEMBLY PROCESSES

(75) Inventors: Gordon S. W. Craig, Palo Alto, CA (US); Eric Jonathan Snyder, South San Francisco, CA (US); Jay Kuang-Jieh Tu, Campbell, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 27 days.

(21) Appl. No.: 10/689,906

(22) Filed: Oct. 20, 2003

(65) Prior Publication Data

US 2004/0089932 A1 May 13, 2004

Related U.S. Application Data

(62) Division of application No. 10/193,807, filed on Jul. 11, 2002, now Pat. No. 6,657,289.
(60) Provisional application No. 60/305,435, filed on Jul. 13, 2001.

(51) Int. Cl.$^7$ .............................................. H01L 21/44
(52) U.S. Cl. ........................ 438/106; 438/107; 438/118
(58) Field of Search ................................ 438/106–127

(56) References Cited

U.S. PATENT DOCUMENTS

| | | | |
|---|---|---|---|
| 4,975,143 A | * 12/1990 | Drake et al. | ................ 438/107 |
| 5,545,291 A | 8/1996 | Smith et al. | |
| 5,757,199 A | * 5/1998 | Maruyama | .................. 324/754 |
| 6,291,896 B1 | 9/2001 | Smith | |

* cited by examiner

*Primary Examiner*—H. Jey Tsai
(74) *Attorney, Agent, or Firm*—Blakely, Sokoloff, Taylor & Zafman LLP

(57) ABSTRACT

An apparatus and methods of making an electronic assembly. The electronic assembly comprises a functional block having at least one asymmetric feature. The functional block comprises an integrated circuitry to perform a function pertaining to the electronic assembly. The electronic assembly further comprises a substrate having a receptor site to mate with the functional block using a fluidic self-assembly process.

33 Claims, 16 Drawing Sheets

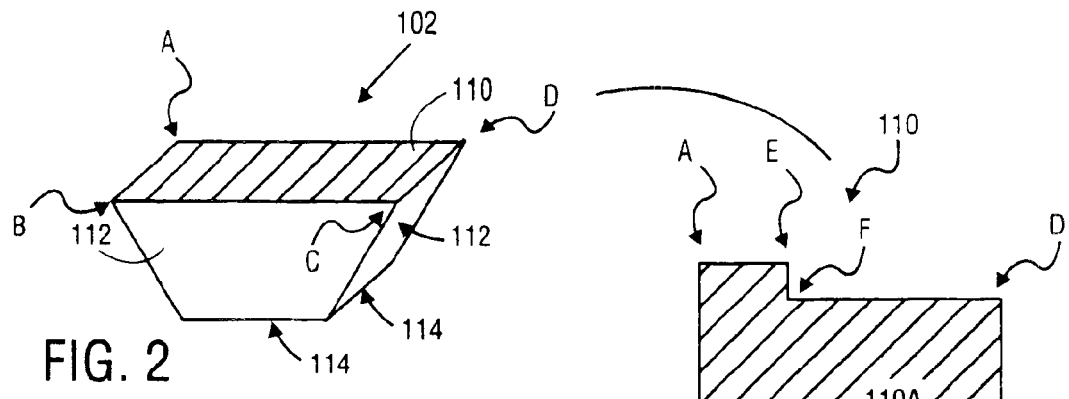
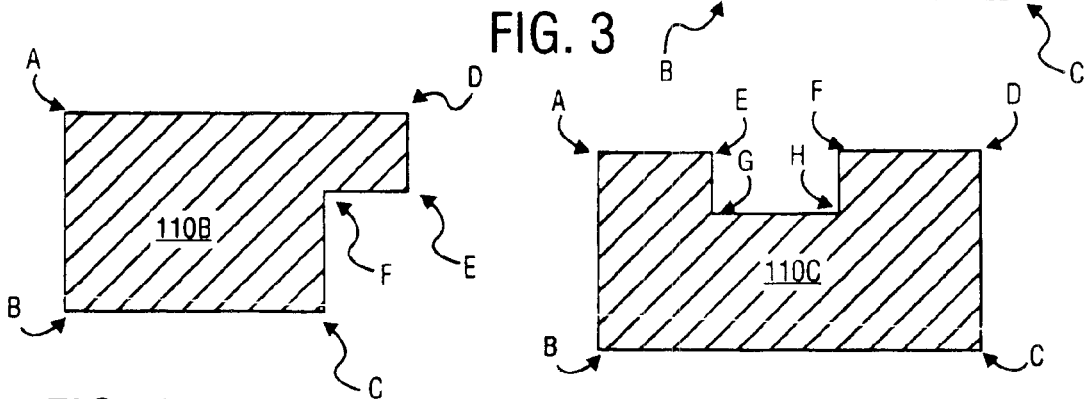
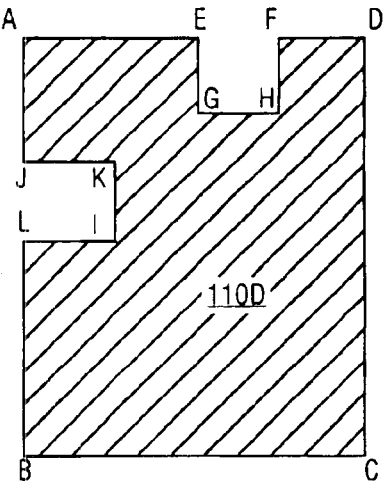

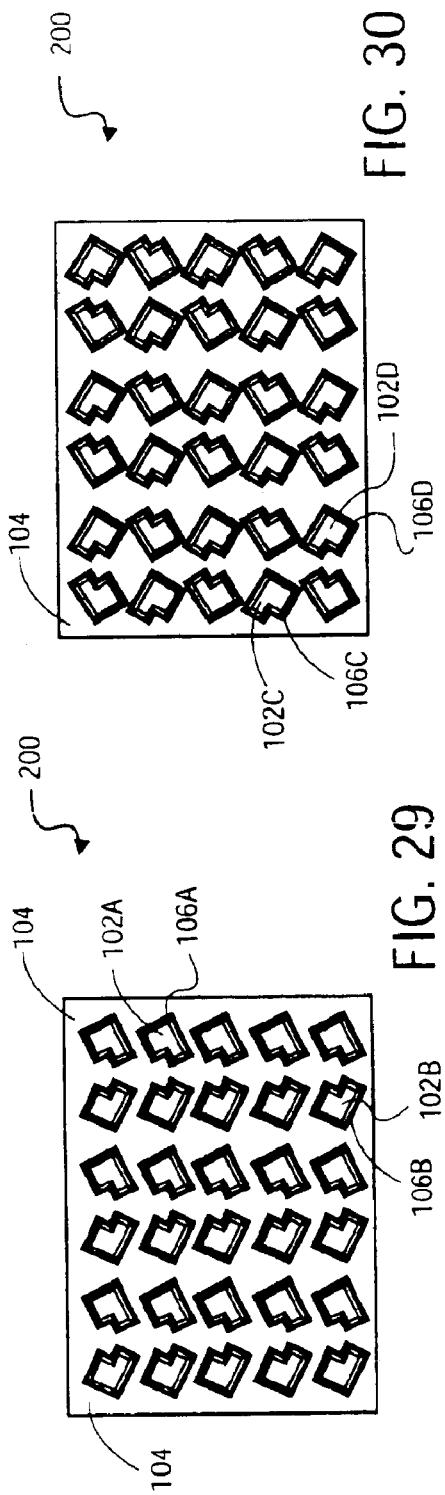
FIG. 29
FIG. 30
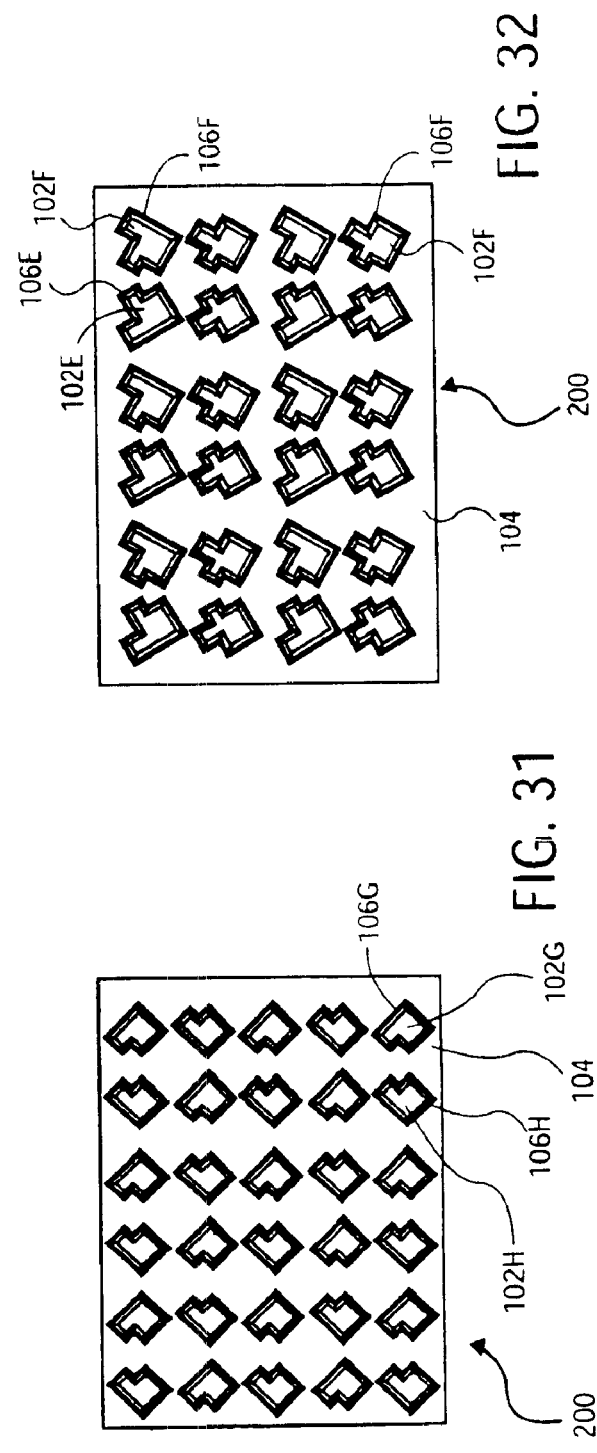
FIG. 31
FIG. 32

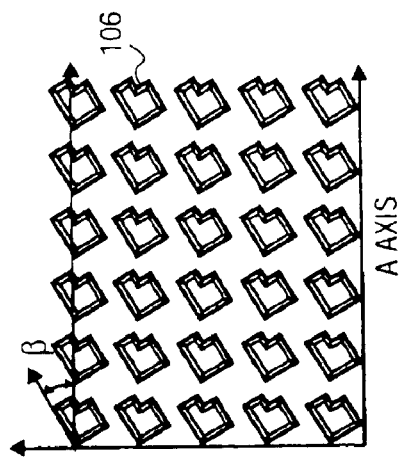
FIG. 36
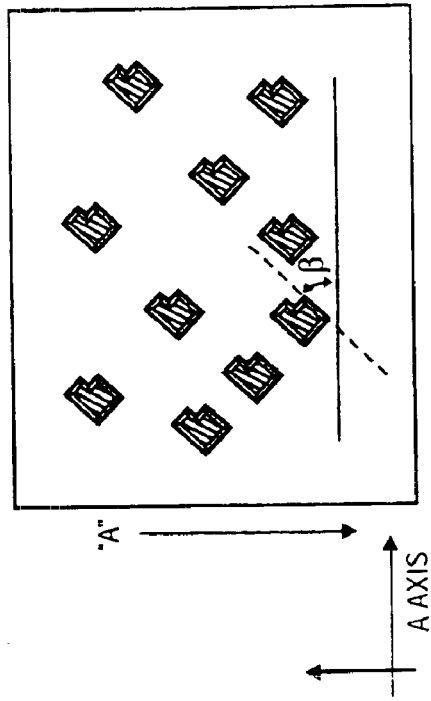
FIG. 38
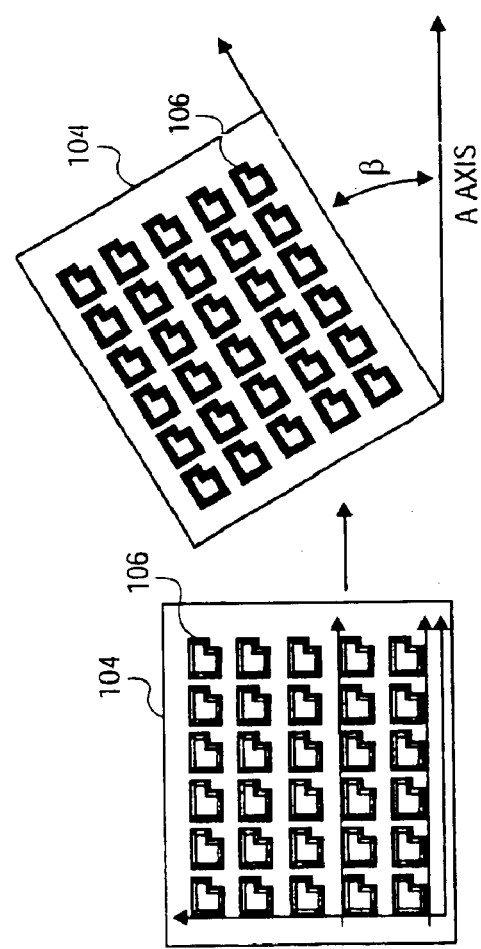
FIG. 35
FIG. 34
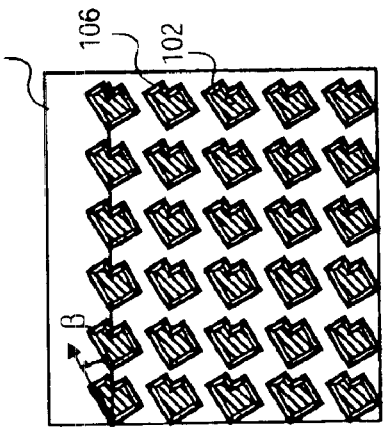
FIG. 37

METHODS AND APPARATUSES RELATING TO BLOCK CONFIGURATIONS AND FLUIDIC SELF-ASSEMBLY PROCESSES

REFERENCE TO RELATED APPLICATION

This application is a divisional application of U.S. patent application Ser. No. 10/193,807, filed Jul. 11, 2002 now U.S. Pat. No. 6,657,289. This application is also based on U.S. Provisional patent application No. 60/305,435 filed on Jul. 13, 2001 entitled "Uses Methods and Apparatuses Relating to Block Configurations and Fluidic Self-Assembly Processes." This application is hereby claiming the priority of the filing date based on the mentioned provisional patent application.

GOVERNMENT RIGHTS NOTICE

This invention was made with government support under at least one of Contract Nos N0014-99-C0395 and N66001-02-C8005 awarded by the Defense Advanced Research Project Agency. The government has certain rights to this invention.

FIELD

The present invention relates generally to methods and apparatuses for configuring functional blocks having integrated circuitries that are used to fabricate electronic assemblies. More specifically, the invention relates to methods and apparatuses for configuring functional blocks to facilitate the deposition of the functional blocks onto a substrate to form the electronic assemblies.

BACKGROUND

Currently, many electronic devices exist that depend on integrated circuitry (IC) components for their functionalities. These electronic devices include for example, radios, audio systems, televisions, telephones, cellular phones, computer systems, computer display monitors, smart cards, to name a few. As these electronic devices become more and more complex, demands for smaller packaging IC increase. Microstructures have been created in which the appropriate ICs can be incorporated. These microstructures are sometimes referred to as functional blocks. These functional blocks are typically deposited into a substrate of an electronic device using methods such as fluidic self-assembly.

An example of a fluidic self-assembly (FSA) is described in U.S. Pat. No. 5,545,291. In a typical FSA process, blocks with integrated circuits thereon are placed into a FSA fluid such as water. The combination of the blocks in the FSA fluid, referred to as a slurry, is dispensed over receptor sites in a substrate. The receptor sites receive the plurality of blocks and the blocks are subsequently electrically coupled to form the electronic assemblies.

The ICs in these functional blocks typically include additional logics and circuit layouts such that when assembled into the substrate, these functional blocks must be assembled in a particular orientation. Current methods to help the functional blocks to assemble in the proper orientation include making the functional blocks to have a trapezoidal shape and the receptor sites receiving these functional blocks to have a complementary trapezoidal shape.

Even with such kind of shaped functional blocks, the current methods in the art do not yield a very efficient filling process. Many receptor sites in the substrate are left unfilled at the end of the FSA process. In many cases, some functional blocks may fall to the surface of the substrate without settling into the receptor sites. Functional blocks not settling into the receptor sites may be due to the weight of some functional blocks being heavier than the fluid causing the functional blocks to fall to the surface of the substrate in which a receptor site does not exist. Alternatively, some functional blocks may be dislodged from the receptor sites even after having been deposited into these receptor sites. The functional blocks being dislodged from the receptor sites may be due to additional treatment to the substrate such as cleaning and removing of excess blocks.

Having the functional blocks not being properly deposited into the receptor sties is problematic because electronic assemblies or devices manufactured with the receptor sites that lack a functional block generally operate less efficiently compared to electronic devices in which all of the functional blocks have been properly placed. Improperly placed or absent functional blocks also lead to a lower overall production yield. A manufacturer may solve this problem by using a variety of methods. For example, the FSA process may be repeated several times over the empty receptor sites. Applying several FSA processes, however, is expensive because it would require additional processing time, larger processing equipment in some cases, and additional functional blocks.

Moreover, most electronic devices need more than one type of IC components. There may also be needs for different types of shaped or sized functional blocks for different types of electronic devices to be assembled on the same substrate. Different types of functional blocks which need to be assembled on the same substrate unnecessarily complicate the FSA processing steps because they require additional steps to assemble each different type of functional block. Additionally, the functional blocks of one type could assemble into the receptor sites meant for different sites, thereby leading to functional failure of the electronic device.

BRIEF DESCRIPTION OF THE DRAWINGS

The present invention is illustrated by way of examples and not limitation in the figures of the accompanying drawings, in which like references indicate similar elements, and in which:

FIG. 2 illustrates an exemplary individual functional block having a trapezoidal shape;

FIGS. 3–7 illustrate examples of configurations of the functional block wherein at least one notch or corner is added to the top surface of the functional block such that the block lacks rotational symmetry about an axis that is perpendicular to the top of the block. The symmetry about an axis that is perpendicular to the top of the block is herein referred to as the top surface rotational symmetry. Notches, corners, tabs, slots, or any other part of the block that causes the block to lose its top surface rotational symmetry are called asymmetric features or asymmetric points in the functional block;

FIGS. 29–32 illustrates exemplary electronic devices having at least two types of different functional blocks having asymmetric features wherein the top surface shape of each type is a chiral structure, or mirror image, of the other and wherein both types can be assembled on the same substrate simultaneously;

FIGS. 34–38 illustrates an exemplary scheme where the receptor sites on a subsrate are rotated, placed, or pre-oriented at an angle with respect to a side of the substrate, such that these receptor sites are oriented in the same direction as the preferred orientation of the functional blocks as they flow across the substrate during the FSA process;

DETAILED DESCRIPTION

In the following description, numerous specific details such as specific materials, processing parameters, processing steps, etc., are set forth in order to provide a thorough understanding of the invention. One skilled in the art will recognize that these details need not be specifically adhered in order to practice the claimed invention. In other instances, well known processing steps, materials, etc., are not set forth in order not to obscure the invention.

The present invention relates to methods of configuring functional blocks that facilitate proper deposition of the functional blocks onto a substrate to form various electronic assemblies or electronic devices. The present invention further relates to apparatuses that incorporate the functional blocks configured according to some exemplary embodiments of the present invention.

In all of the embodiments to be discussed below, the functional block has a top surface upon which at least one circuit element is situated. The circuit element on the top surface of the functional block may be an ordinary integrated circuit (IC) for any particular function. For example, the IC may be designed to drive one or more pixels of a display. The IC may also be designed to receive power from another circuit for the operation of a passive RF ID tag wherein the IC form part of the RF ID tag. The IC may also be designed to control a smart card. Alternatively, the IC may be designed to receive power from an energy source (e.g. battery) for the operation of an active RF ID tag. The functional block may be created from a host substrate and separated from this host substrate. This method of making the functional block can be found in the method described in U.S. Pat. No. 6,291,896 which is entitled "Functionally Symmetric Integrated Circuit Die." Alternatively, the functional block can be the NanoBlock® IC's made by Alien Technology, Morgan Hill, Calif.

Figure 1:
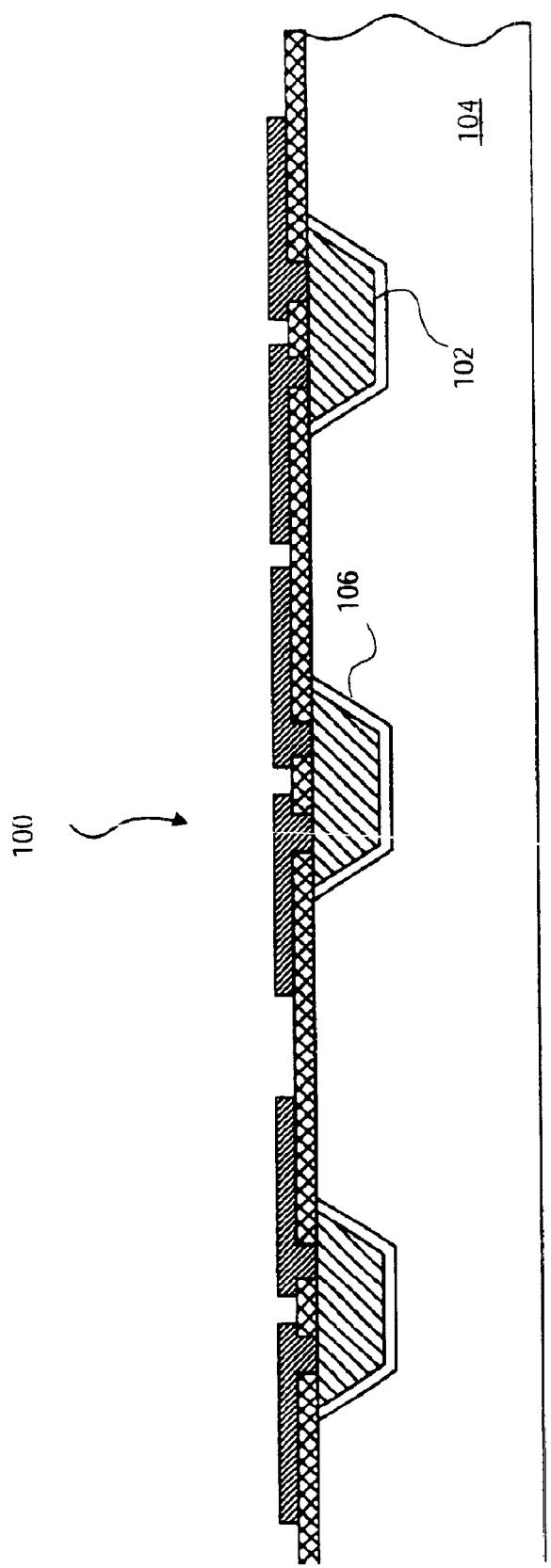
FIG. 1 illustrates an exemplary electronic assembly having a plurality of functional blocks deposited within a matching receptor site on a substrate.

FIG. 1 illustrates an exemplary embodiment of an electronic device 100. The electronic device 100 includes a plurality of functional blocks 102 each having at least one asymmetric feature. Although FIG. 1 illustrates three functional blocks 102, certain electronic devices may be need only one functional block 102 and certain electronic device may need more than three. The various number of functional blocks 102 is well within the scope of the present invention's embodiments. Each of the functional blocks 102 includes at least an IC component (not shown) on the top surface of the functional block. FIG. 2 shows that in one example, to create the functional blocks 102 can be configured to have trapezoidal shapes in which the top surfaces 110 of these blocks have dimensions that are larger than the dimension of the bottom surfaces 114. The functional blocks 102 have beveled edges 112, which allows for the distinction between top surfaces 110 and bottom surfaces 114 of the functional blocks 102.

Returning to FIG. 1, the electronic device 100 also includes a substrate 104 which further includes a plurality of receptor sites 106 configured to mate with the functional blocks 102. In the case where the functional blocks 102 have the trapezoidal shapes, the receptor sites 106 also have trapezoidal shapes complimentary to receive fit or mate with these functional blocks 102. Additionally, the receptor sites 106 will have dimensions that are slightly larger than dimensions of the functional blocks 102 so as to snugly mate with the functional blocks 102. The substrate 104 can be made out of glass, plastic, foil, or any other suitable material depending on the application of the electronic device 100. The substrate 220 can be flexible, rigid, transparent, opaque, or any combination of the above. In one example, the substrate 220 is material that is conventionally used to make a flat panel display for a computer, a smart card, a cellular phone, a digital camera, or a digital camcorder such as glass or plastic.

The trapezoidal shape of the functional blocks 102 prevents the blocks from being deposited into the receptor sites 106 with the top surfaces 110 facing down into the receptor sites. With the top surface 110 facing up, the IC components located on the top surface 110 can interconnect with other necessary components to complete the necessary connections for the electronic device 100 to be properly functionary. The trapezoidal shape of the functional blocks 102 and the complementary trapezoidal shape of the receptor sites 106 ensure that once properly deposited, the functional blocks 102 will have their top surfaces 110, which is the side with the IC components, facing upward for necessary interconnections. With the top surface 110 facing up, the IC components located on the top surface 110 can interconnect with other necessary components to complete the necessary connections for the electronic device 100 to be properly functional. However, the trapezoidal shape alone does not prevent the functional blocks 102 from being deposited with a wrong orientation even though the top surface of the functional blocks 102 is facing up. Additionally, functional blocks 102 that are improperly oriented in the receptor sites (for example, when a functional block 102 is rotated 90 degrees from the proper orientation) are very readily cleared by a fluid streaming over the substrate surface. This is caused by the fact that the asymmetrically shaped functional blocks 102, if not assembled so as to exactly match their matching receptor sites 106, will protrude from the receptor site 106. These protrusions cause the functional blocks 102 to easily be dislodged from the receptor sites 106.

One way to ensure proper orientation when the functional blocks 102 are deposited in the receptor sites 106 is to create an asymmetric feature in the functional blocks 102 such that that functional blocks 102 can only fit into the receptor sites 106 in one particular orientation. As mentioned above, when at least one notch, tab or corner is added to the top surface of the functional block such that the block lacks rotational symmetry about an axis that is perpendicular to the top of the block, the addition is referred to as an asymmetric feature. The symmetry about an axis that is perpendicular to the top of the block is again referred to as the top surface rotational symmetry. Notches, corners, tabs, slots, or any other part of the block that causes the block to lose its top surface rotational symmetry are called asymmetric features or asymmetric points in the functional block 102. In one exemplary embodiment, a unique asymmetric feature is added to a side preferably, to the top surface 110 of each of the functional blocks 102. Adding the asymmetric feature to the blocks 102 therefore require adding a complementary asymmetric feature to the corresponding receptor sites 106 in order for the blocks 102 to mate with or be deposited to the receptor sites 106. The complementary asymmetric feature is referred to as a "key" in this discussion. The key thus will fit the asymmetric feature of the functional block 102. In one example the asymmetric feature is created by adding at least one notch to a side of each of the functional blocks 102. The asymmetric feature can be a notch, a tab, or groove feature added to the blocks wherein the key is also added to the receptor site and the key is configured to fit the particular asymmetric feature. In one example, the asymmetric feature has right angle corners; and in this example, the key will also have the same right angle corners. In this example, the addition of the asymmetric feature can be viewed as an addition of an additional corner or additional corners to the functional blocks 102. In a preferred embodiment, the corners are added to the top surface 110 of the functional block 102.

FIGS. 3 to 7 illustrate some examples of various configurations of the top surface 110 of the functional block 102 (e.g., top surfaces 110A, 110B, 110C, 110D) with at least one additional corner added to create the asymmetric feature. The top surface of the functional block 102 typically has a square or rectangle dimension and as such, typically has four corners, corner A, B, C, and D. In some examples, (e.g., FIGS. 3, 4 and 6), corners E and F are added to the top surface side 110 of the functional block 102 and thus, the top surface of the functional block 102 has five corners. These five corners make up the asymmetric feature that gives the functional blocks 102 their asymmetrical characteristics. In some other examples, (e.g., FIGS. 5), corners E, F, G, and H are added to the top surface side 110 of the functional block 102 and thus, the top surface of the functional block 102 has eight corners. In yet some other examples, (e.g., FIGS. 7), corners E, F, G, H, I, J, K and L are added to the top surface side 110 of the functional block 102 and thus, the top surface of the functional block 102 has twelve corners. Thus, in these various configurations the additional corners form the key features that are unique to the particular functional blocks 102. In another example, the additional corners are not right angle corners such as those shown in FIGS. 2 to 7. The non-right angle notches can simply be an area of any particular shape, (e.g., a "U" shape) carved into the top surface 110 of the functional block 102.

The additional notches or corner(s) can be additive or subtractive from the original rectangle or square shape of an otherwise square or rectangular top surface of the functional block 102. The addition of the asymmetric feature can thus be created by removing material from the top surface 110 of the functional block 102 to form the notches or the corners. Alternatively, the addition of the asymmetric feature can be created by adding one or two extra tabs to the top surface 110 of the functional block 102 to create the top surface 110 as shown in the FIGS. 2 to 7.

In one example, the addition of the asymmetric feature improves the tendency of the properly assembled functional blocks 102 to stay in their matched receptor sites 106 during fluidic self-assembly (FSA™) processing. This, along with improved clearing of improperly oriented functional blocks 102, will result in higher filling efficiencies for the substrate 104.

FIGS. 8 to 11 illustrate examples of how the functional blocks 102 with at least one asymmetric feature is deposited into the substrate 104 in which the functional block 102 mates with the complementary receptor site 106. Each of the functional blocks 102 has the asymmetric feature as shown in these figures. Each of the functional blocks 102 shown in these figures can have the trapezoid shape. And, the corresponding receptor site 106 for each of these blocks 102 will also have the similarly sized trapezoid shape to snugly receive or mate these blocks 102.

Each of the receptor sites 106 has a complimentary shape, and the key that fits the asymmetrical feature. Each receptor site 106 is thus configured to allow the functional block 102 of a matching shape and matching asymmetrical feature fitting the key to fit snuggly into the receptor sites 106.

Figure 8:
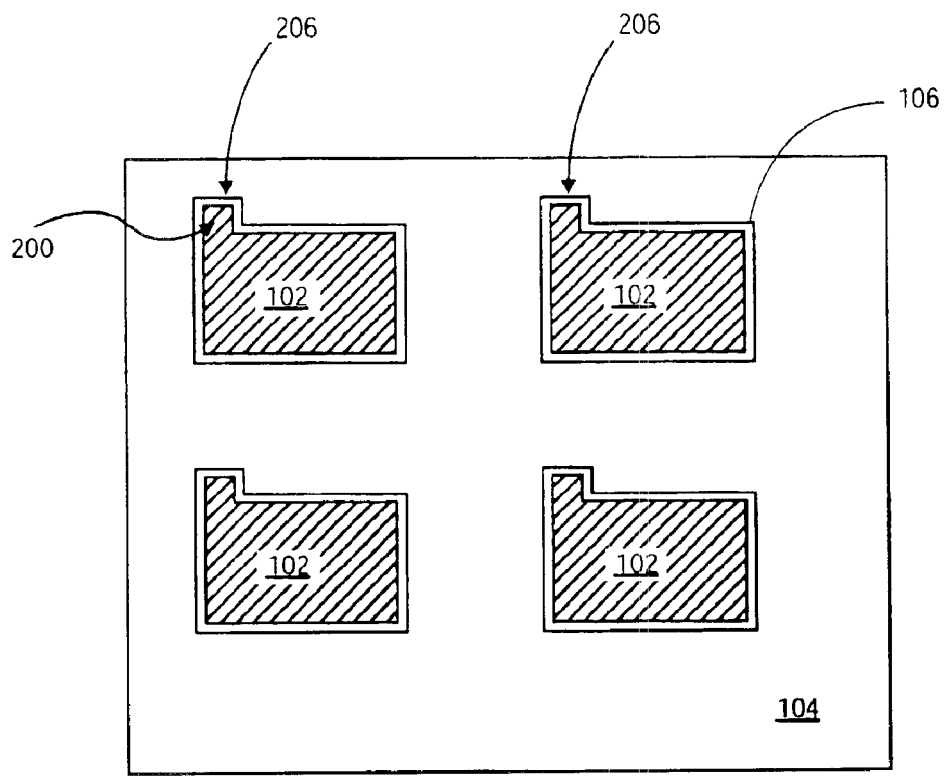
FIGS. 8–11 illustrate exemplary functional blocks with different configurations of asymmetric features being deposited into receptor sites configured to mate with the functional blocks.

In one exemplary embodiment, the functional block 102 has a trapezoidal shape with beveled edges as discussed above. The beveled edges ensure that the functional block 102 will mate with the receptor site 106 in a way that the top surface 110 faces up. The top surface 110 of the functional block 102 may have a rectangular, square, or any other convenient shape. Additionally, as illustrated in FIG. 8, the functional block 102 includes an asymmetric feature such as a tab or a notch 200. To match the functional block 102, the receptor site 106 is configured to have a key 206 that will fit the asymmetric feature (the notch 200). Additionally, the receptor site 106 configured is to be trapezoidal shape of similar dimension to the dimension of the functional blocks 102. The matching of the asymmetric feature 200 and the key 206 ensures that the functional blocks 102 will be deposited into the receptor sites 106 with the proper orientation.

Figure 9:
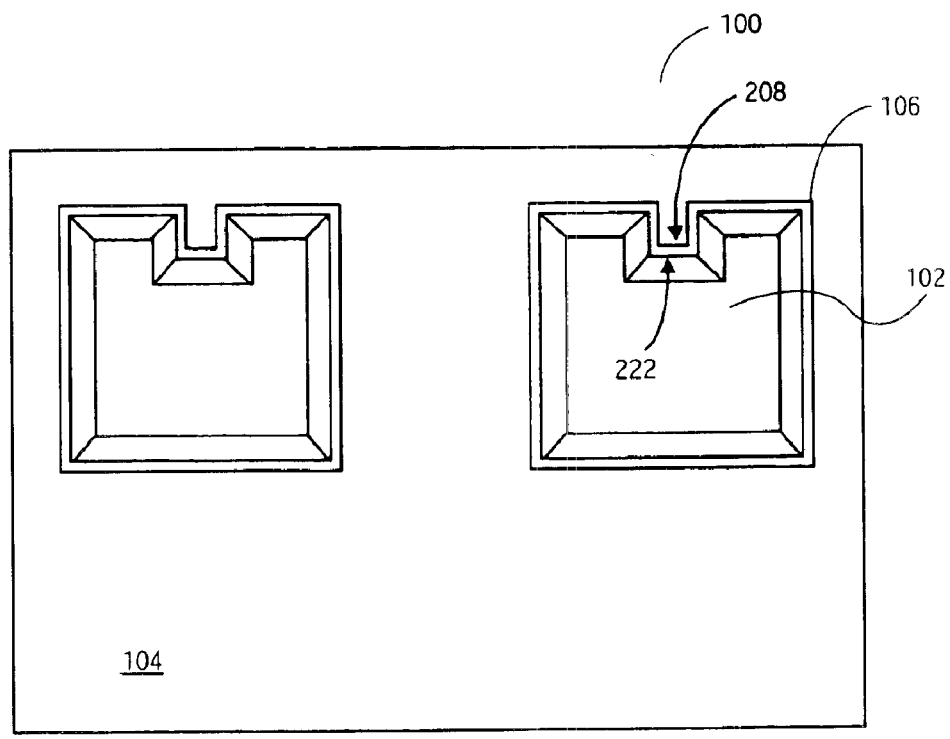

In another example, a shown in FIG. 9, each of the top surfaces of the functional blocks 102 has an asymmetric feature such as a notch 222 that is created into one of the edges of the top surface block 102. Each of the receptor sites 106 has a key 206 that will fit into the notch 222. Similar to the example in FIG. 8, the matching of the notch 222 and the key 206 ensures that the functional blocks 102 will be deposited into the receptor sites 106 with the proper orientation.

Figure 10:
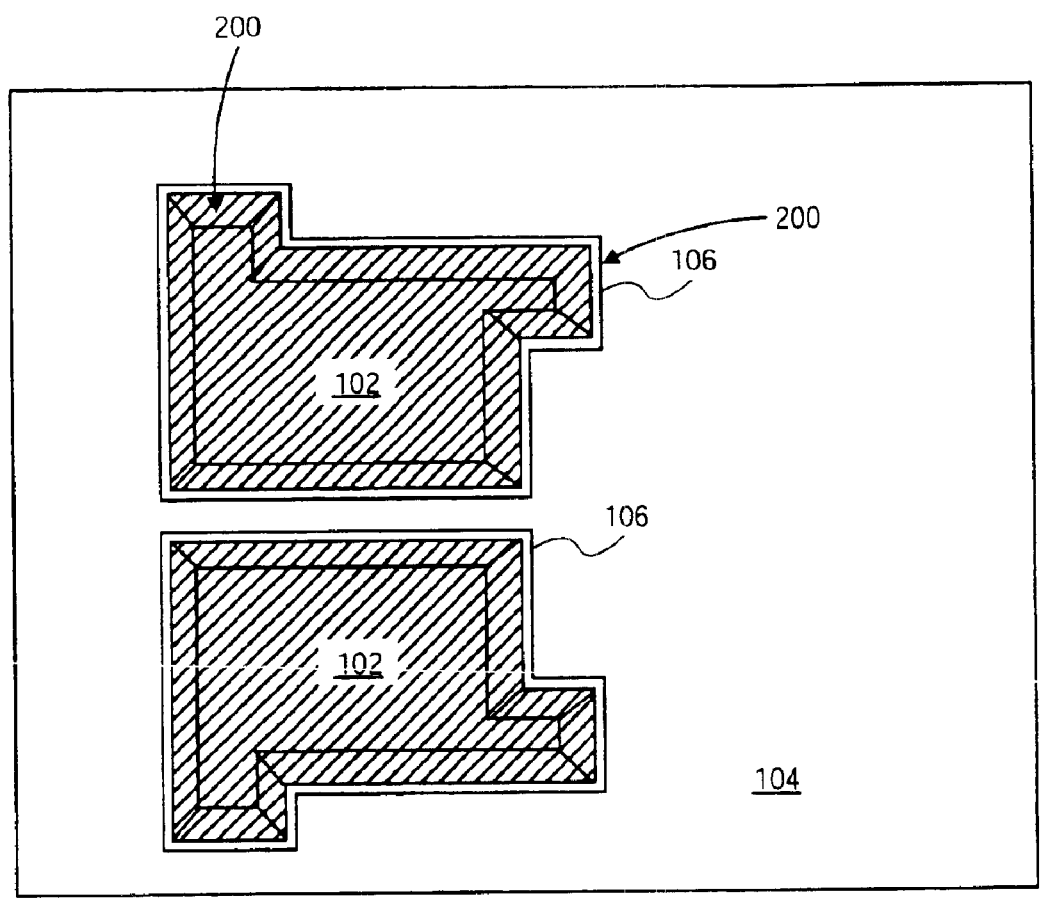
Figure 11:
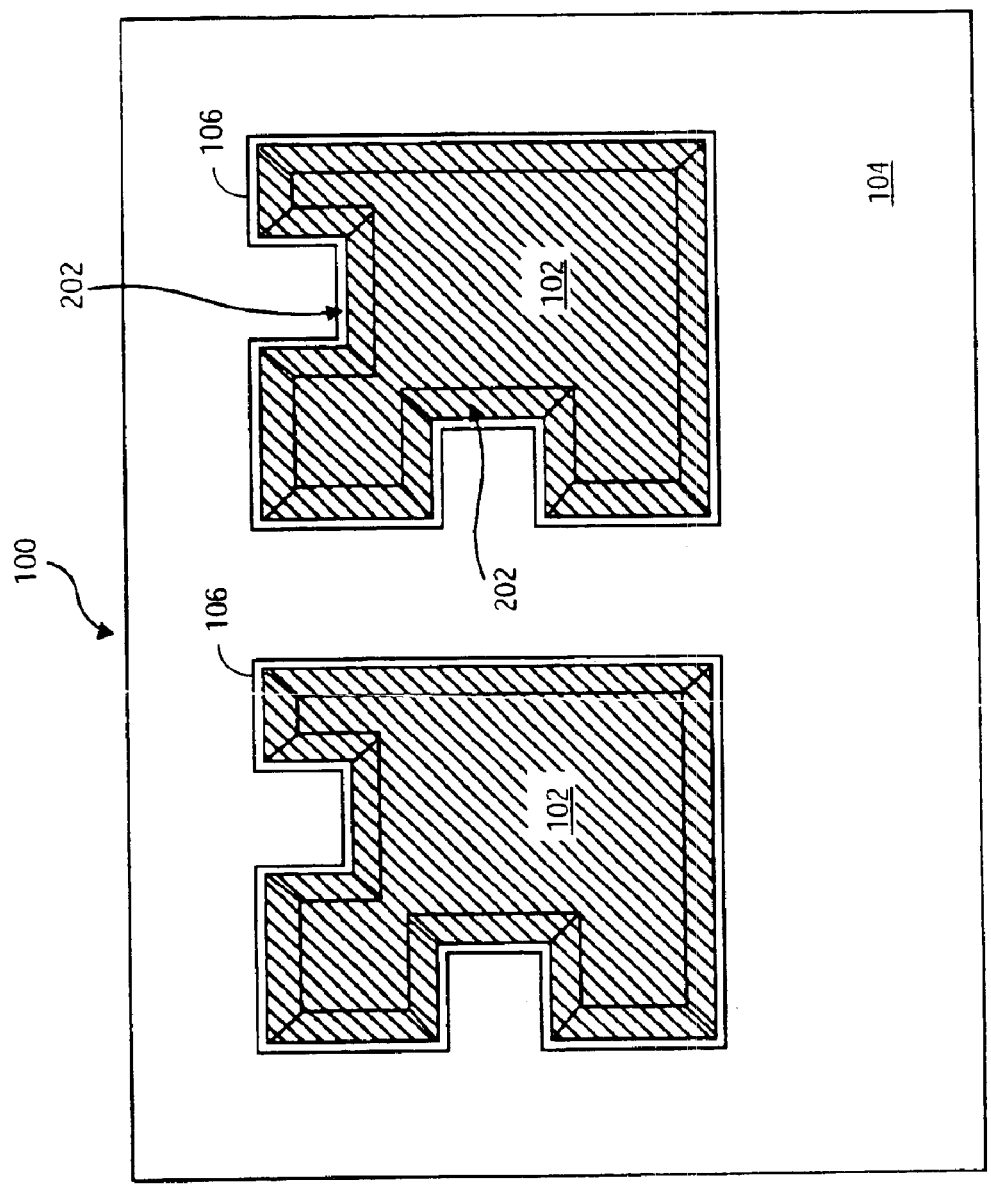

FIG. 10 illustrates yet another example, which is similar to the example shown in FIG. 8, except that there is more than one asymmetric features, for example, more than one notch 200 in each of the functional blocks 102 in this case. And, FIG. 11 illustrates yet another example, which is similar to the example shown in FIG. 9, except that there is also more than one asymmetric feature, e.g., more than one notch 202 in this case. Each of the receptor sites 106 is thus configured accordingly with the matching shape with the functional block 102, and a key that will fit the asymmetric feature on the particular functional blocks 102.

The functional blocks having additional asymmetric feature such as notches or corners (e.g., E, F, G, H, I, J, K, and L) are all consistent with current processing of silicon. Moreover, when the additional asymmetric features such as notches or corners are all right (or nearly right) angled corners or notches, the addition of one or more corners to the functional blocks (and their corresponding substrate receptor sites) improves the settling of the functional blocks in the receptor sites. Additionally, the extra corners or notches help the device to seat and, once seated, remain seated during the FSA™ process.

Figure 12A:
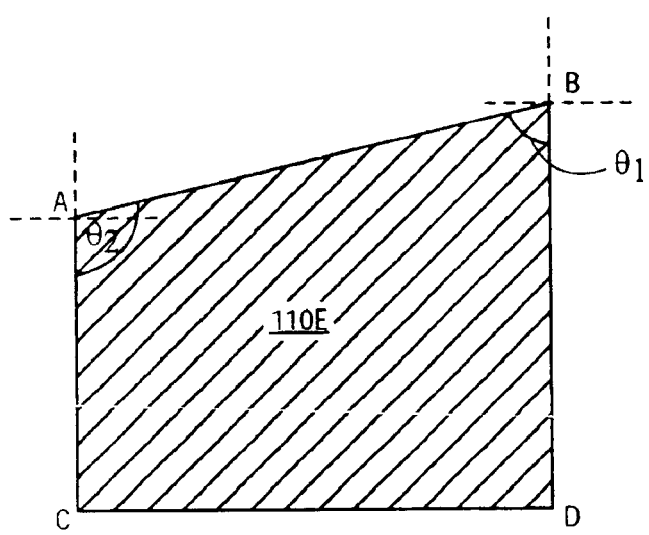
FIGS. 12A–12B illustrate an exemplary functional block with no top surface rotational symmetry. The asymmetric feature in this case is that one of the angles ($\theta_1$) on the top side of the functional blocks is an acute angle.
Figure 12B:
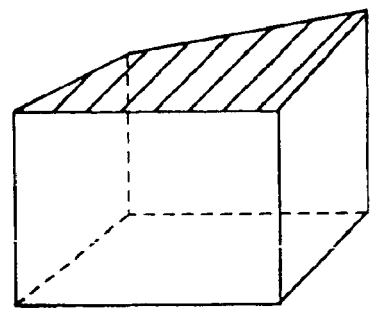

FIGS. 12A and 12B illustrate another exemplary configuration of the functional block 102 to create asymmetric feature. In this example, the feature that causes the functional block 102 to lack top surface rotational symmetry is the acute angle ($\theta_1 < 90°$) on the top surface of the block. Other types of "non-right angles" can also be used in any combination at any corner of the functional block 102 to create the lack of top surface rotational symmetry. The angle can be any angle smaller than or greater than 90-degree.

Figure 13:
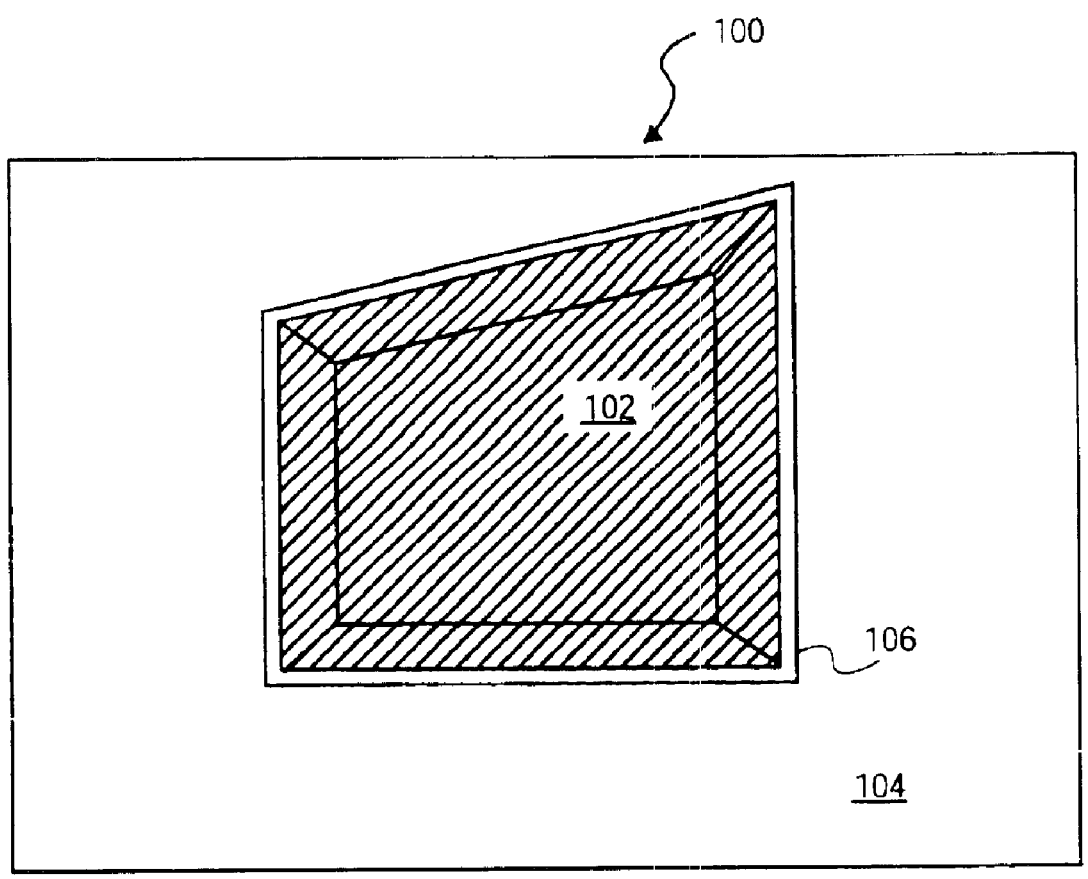
FIG. 13 illustrates an example of the functional block with no top surface rotational symmetry being deposited into a receptor site configured to mate with the functional block wherein the receptor site has the similar shape.

FIG. 13 illustrates an example of how the functional blocks 102 of FIGS. 12A and 12B which has the lack of top surface rotational symmetry is deposited into the substrate 104 in which the functional block 102 mates with the complementary receptor site 106. As mentioned, each of the receptor sites 106 has a complimentary shape that are configured to allow the functional block 102 of matching shape to fit snuggly into the receptor sites 106. As shown in FIG. 13, the lack of symmetry in the functional block 102 allows only one way of mating the functional block 102 to the receptor site 106.

Figure 14:
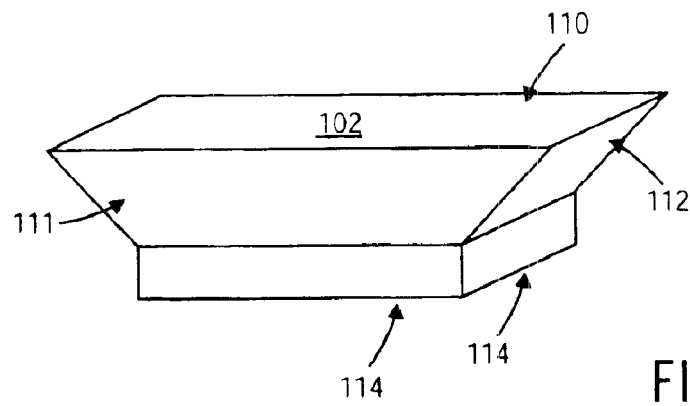
FIG. 14 illustrates an exemplary functional block having partially beveled edges.
Figure 15:
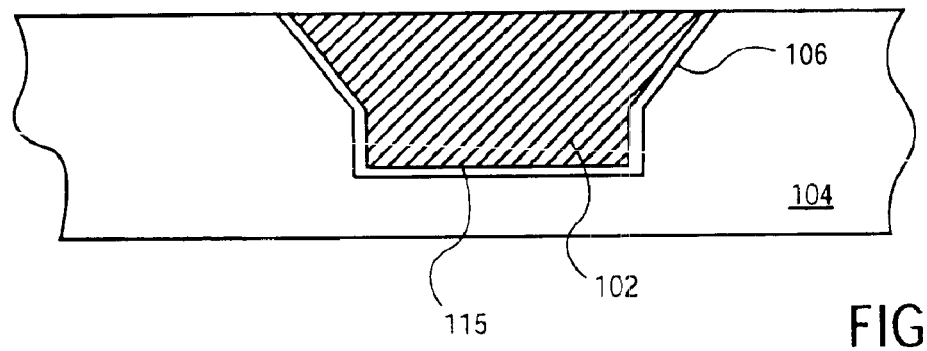
FIG. 15 illustrates an exemplary functional block having partially beveled edges being deposited into a receptor site having the same partially beveled edges configured to mate with the functional block.
Figure 16:
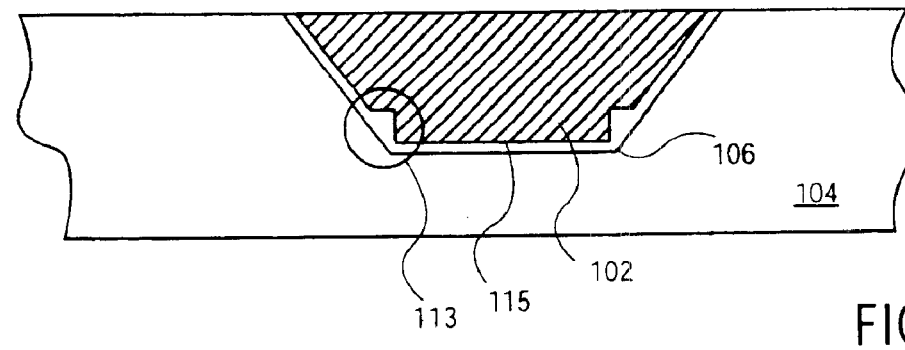
FIG. 16 illustrates another exemplary functional block having partially beveled edges configured such that the block can be deposited into a completely beveled receptor site such as a trapezoid shaped receptor site.

The asymmetrical features in the functional blocks 102 can also be added to the top surface of a partially beveled functional blocks 102. In many applications, a non-silicon semiconductor material must or should be used to make the functional blocks 102. Most non-silicon materials do not readily etch to give smooth, beveled edges, especially at the 55 degree sidewall angle of a Si(100)/Si(111) crystal edge. Moreover, some of the non-silicon blocks can be very large, up to 2 mm×4 mm in size and 0.5 mm thick. FIGS. 14 to 16 illustrate that in one example, the functional block 102 comprises partially beveled edges. In this example, only the top portion of the functional block 102 has beveled edges 111. The remaining portion of the functional block 102 has vertical edges 114. The vertical edges 114 imply that these edges 114 are at right angles to a horizontal plane of the functional block 102, namely, to the top surface 110 or the bottom surface 115 (not visible in FIG. 14, but see FIG. 15 or 16) of the functional block 102. The vertical edges 114 thus extend perpendicularly a horizontal plane of the functional block 102. The partially beveled edges at the top portion of the functional block 102 enables the distinction between the top surface and the bottom surface of the functional blocks similar to the beveled functional blocks 102 with the trapezoidal shape discussed in FIG. 2. The partially beveled edges also prevent the functional blocks 102 from being deposited into the receptor sites 106 having configuration to accept the functional blocks 102 in an upside down manner.

FIG. 15 illustrates an exemplary embodiment of a substrate 104 having a receptor site 106 that is configured to match the functional block 102 that has the partially beveled edges. The receptor site 106 must have the shape that is also partially beveled and configured with the vertical edges at the appropriate place to be able to receive the partially beveled functional block 102 shown in FIG. 14.

FIG. 16 illustrates an exemplary embodiment where the beveled edges of the functional block 102 are configured so as to allow more latitude for shape of the receptor site 106. The functional block 102 in this embodiment include a notch 113 along the bottom portion of the sidewall of the functional block 102. The receptor site 106 in this case needs not have the partially beveled edges as in FIG. 15 and can indeed have the shape of a trapezoidal receptor site 106. The functional block 102 with the partially beveled edges will still fit easily into the completely beveled receptor site 106.

To facilitate proper orientation of the functional blocks with the partially beveled edges as shown in FIGS. 14–16, the top surface 110 of these blocks can be configured to have the asymmetric feature as described above. Thus, the receptor sites 106 to be mated with the partially beveled functional blocks 102 can be configured to have a key that is complementary to the asymmetric feature as described above. See, for example, FIGS. 3–7.

Figure 17:
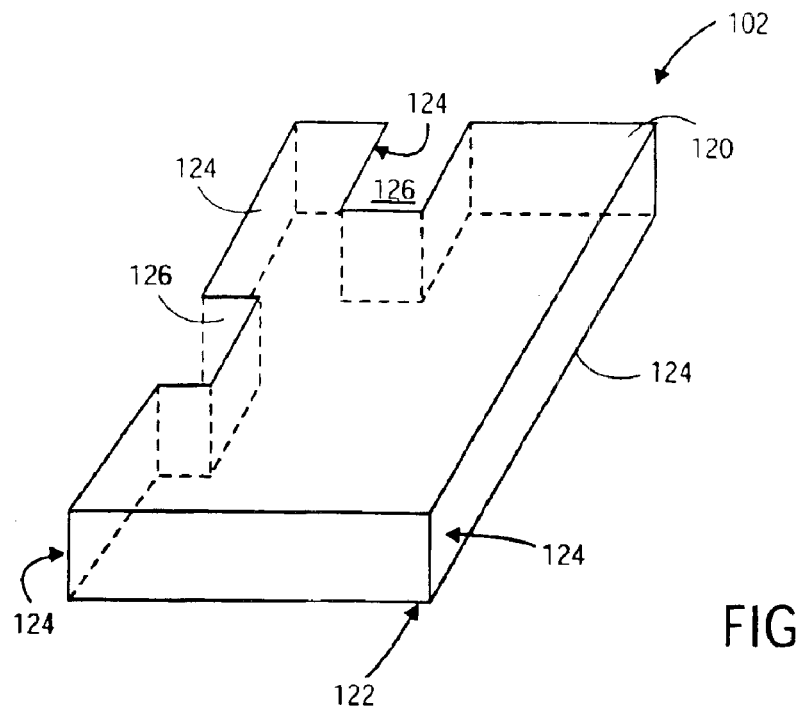
FIG. 17 illustrates an exemplary functional block having vertical edges and at least one notch or corner to create the asymmetric features.
Figure 18:
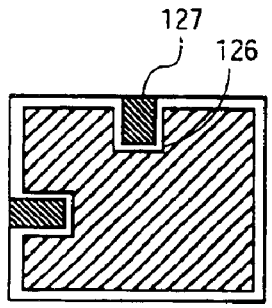
FIGS. 18–22 illustrate exemplary functional blocks having vertical edges and at least one asymmetric feature being deposited to receptor sites configured to mate with these functional blocks wherein the receptor sites include tabs, slots, corners, or other physical features, referred to herein as "keys", that are shaped to fit the asymmetric feature(s) on the functional blocks.
Figure 19:
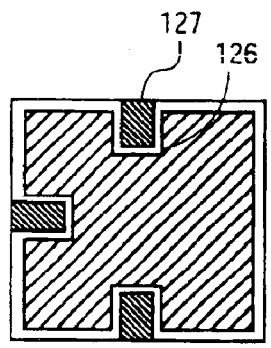
Figure 20:
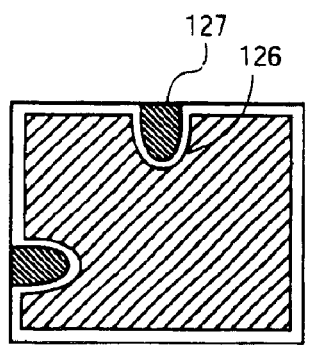
Figure 21:
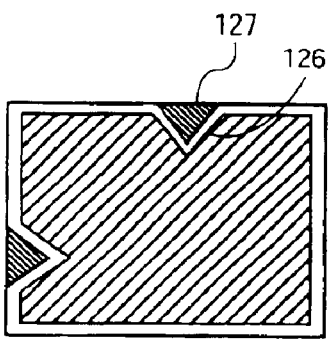
Figure 22:
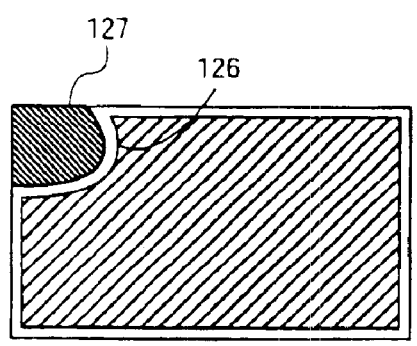
Figure 23:
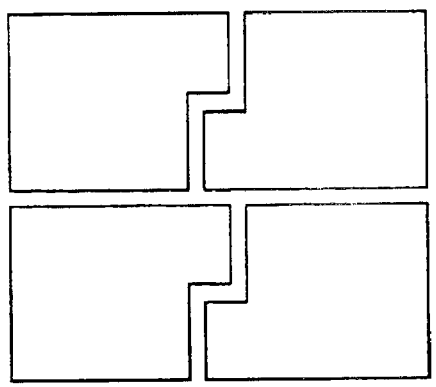
FIGS. 23–28 illustrate exemplary schemes of configuring the functional blocks with asymmetric features such that they enable the most efficient use of the starting material used to make these blocks.
Figure 24:
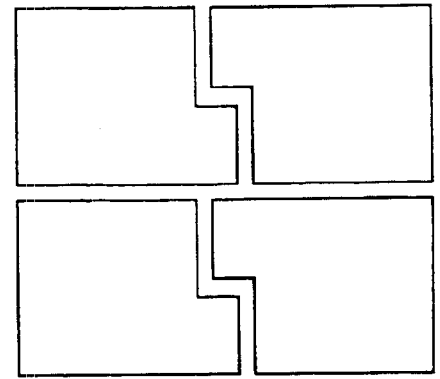
Figure 25:
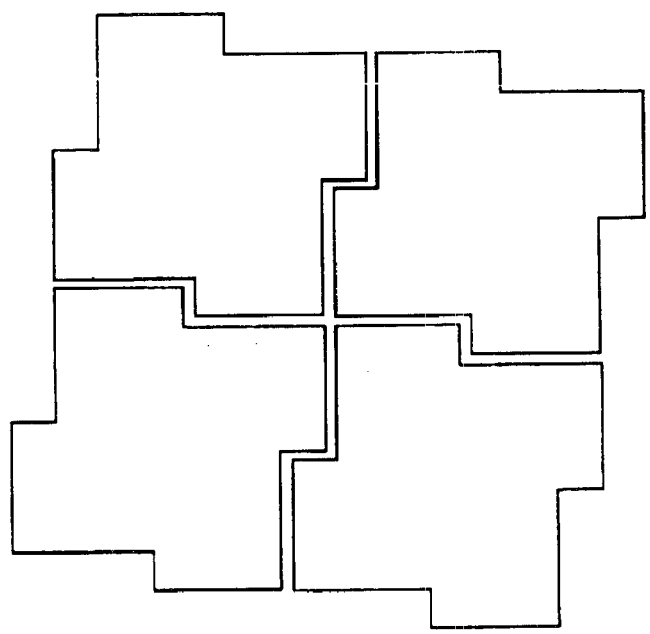
Figure 26:
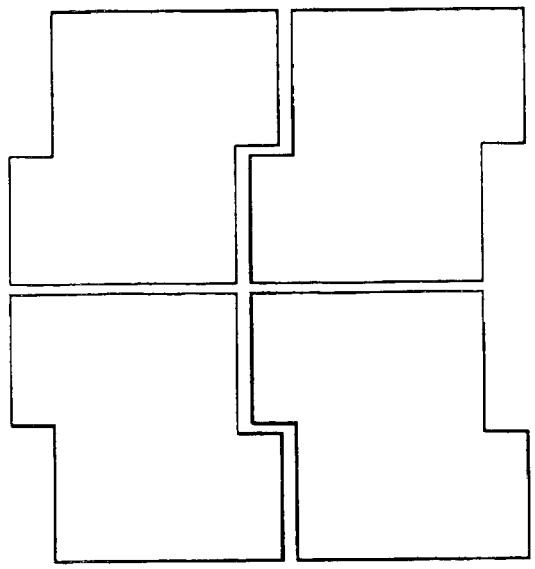
Figure 27:
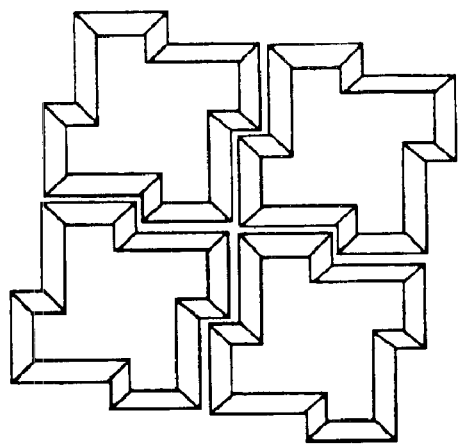
Figure 28:
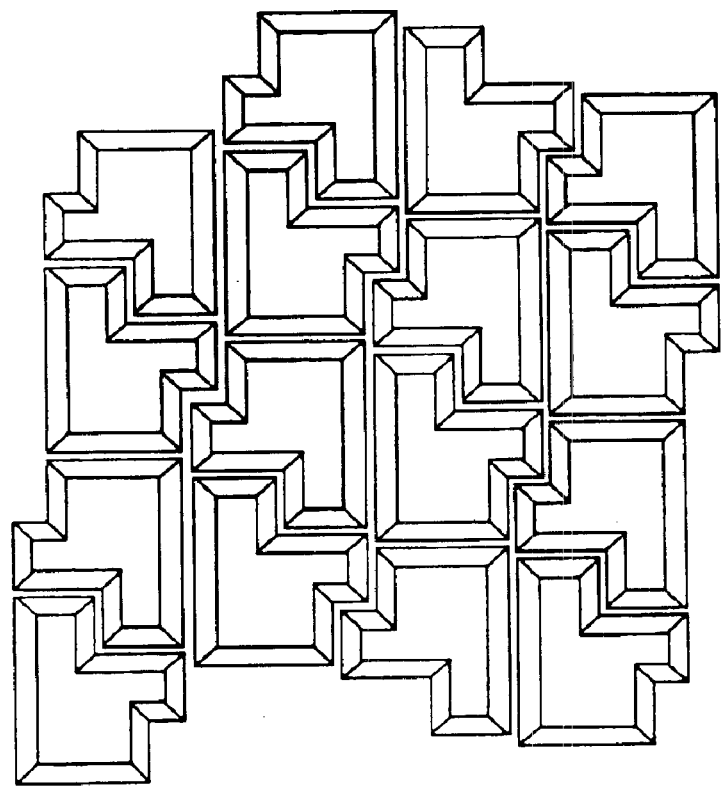

FIG. 17 illustrates that the asymmetric feature of the functional blocks 102 can be created for blocks that does not include partially beveled or beveled edges such as those discussed in FIGS. 2 and 14. The functional blocks 102 having "non-beveled" or "non-partially-beveled" edges are referred to as functional blocks 102 with vertical edges. FIG. 17 illustrates an exemplary embodiment of a functional block 102 having at least one asymmetric feature and having no beveled edges or partially beveled edges along the sidewalls of the block's structure. Vertical edges of the blocks are sidewalls of the blocks that are at right angles to horizontal planes of the blocks. For example, the vertical edges 124 of the functional block 102 are at right angles to the top surface 120 or the bottom surface 122. These vertical edges 124 are perpendicular to the horizontal plane of the block 102. One of the benefits of straight (or vertical) walled functional block 102 is that they could be formed from a variety of materials in a manner consistent with standard semiconductor processing (using, for example, a precision dicing saw to separate the functional blocks 102).

In one exemplary embodiment, the functional block 102 having an integrated circuitry comprises a top surface 120, a bottom surface 122, a plurality of vertical edges 124, at least one asymmetric feature such as a notch 126 created into at least one side of the functional block 102. The vertical edges 124 extends perpendicularly from the top surface 120 or the bottom surface 122. The notch 126 can be a section carved out of the functional block as shown in FIG. 17. The notch 126 can be a right angle notch or a curved angle notch depending on easy of manufacturing. The notch 126 will ensure proper orientation of the functional block 102 as it is assembled into the receptor site 106. Additionally, the asymmetric feature can be created by cutting through completely from the top surface 120 to the bottom surface 122 or cutting through only the top portion of the functional block 102.

FIGS. 18 to 22 illustrate the mating of the functional block having the vertical edges 124 and at least one asymmetric feature into a substrate having the complimentary receptor site 106. The receptor site 106 is configured to have matching shape and a plurality of keys that are complementary to the asymmetric features to mate with the functional block 102. In a preferred embodiment, each of the receptor sites 106 has the same shape as the functional block 102. For instance, as shown in FIG. 17, the functional block 102 has a rectangular shape; the receptor site 106 thus must have the same rectangular shape with a slightly larger dimension to snuggly fit the functional block 102 into the receptor site 106. Further, each of the receptor sites 106 has the same number of keys 127 as the number of the asymmetric features, the notches 126 present on the functional block 102. Preferably, the keys 127 have the same shape and configuration as the asymmetric features or the notches 126 present in the functional block 102 as shown in FIGS. 18–22. With the matching keys and asymmetric feature, the proper orientation of the functional block 102 is easier to achieve.

However, another concern, as mentioned above, is to have the functional block 102 deposited up side down even if the orientation is correct. For example, if the functional block 102 is made out of a square or circular block with only one notch 126, the notch 126 may mate perfectly well with a complimentary asymmetric feature 127 in the corresponding receptor site, but the functional block 102 may be flipped up side down. The functional block 102 having vertical edges of this embodiment must have a shape that prevents it from mating with the corresponding receptor site with the top surface 120 facing downward and contacting the bottom of the receptor site. The shape of the functional block 102 is configured such that when the functional block 102 is mated to the corresponding receptor site, the top surface 120 will face upward, the bottom surface 122 will face the bottom of the corresponding receptor site and the block 102 will be in a proper orientation. In one example, the functional block 102 has a rectangular shape and at least one notch for its asymmetric feature (e.g., FIG. 17, notch 126 and FIG. 22, notch 128). The rectangular shape and the one notch will prevent incorrect mating of the functional block 102 and the corresponding receptor site 106.

FIGS. 18 to 21 illustrate various examples of the functional block 102 having vertical edges and two or more asymmetric features to facilitate proper orientation of the functional block 102 into the corresponding receptor site. With two or more notches, the functional block 102 having vertical edges can have much more shape options as exemplified in FIGS. 18 to 21.

As discussed above, each of the functional blocks 102 illustrated in FIGS. 2 to 22 includes at least one asymmetric feature that is sufficiently unique to ensure that there is only one unique orientation for proper assembly of each of the functional blocks 102 into the receptor sites 106. It is thus preferred that the asymmetric feature in the blocks has to match the key in the receptor site in order for the block to fit at all into the receptor site.

In another exemplary embodiment, the each of these functional block configurations can be made to have a right-handed and left-handed partner with the same dimensions but fabricated as mirror images. Each of the functional blocks can thus be a chiral structure of another functional block. Each block of the pair of the right-handed and left-handed functional blocks can be constructed with a different circuit or circuit function. And, each of the functional blocks can have a different type of integrated circuitry components and can be used for different function of a particular electronic device. Because they would only assemble in their matched receptor sites, the two functional blocks could be co-mingled and simultaneously assembled in an FSA™ process and can even end up in the same electronic device. Furthermore, because each block of the chiral pair blocks differs from each other only in the location of the asymmetric feature(s) there is only a minimal difference, if any, in the fluidic handling of the two bocks in the FSA™ process. The FSA™ process is thus greatly improved.

Further yet, it is important from a production cost standpoint to limit the amount of unused material (e.g. unused silicon wafer space) during the fabrication of key shaped functional blocks 102. In another exemplary embodiment, the functional blocks 102 has a shape, and at least one asymmetric feature, that will enable an optimal and efficient use of the starting material that is used to make these functional blocks 102. As mentioned, the functional blocks 102 is created from a starting material such as a silicon wafer upon which circuitry components are created using known method in the art. The functional blocks 102 are then removed from the starting material, also using methods known in the art. (See for example, U.S. Pat. No. 6,291,896, which is entitled "Functionally Symmetric Integrated Circuit Die").

It is thus desirable to select the size and shape of the functional blocks 102 such that the most efficient use of the semiconductor wafer is used. Efficient use of the starting material is straightforward in the case of the square and rectangular functional blocks 102. However, in the case of asymmetric functional blocks, and especially with asymmetric features it is more complicated. Nonetheless, efficient layouts of the functional blocks circuitry on the semiconductor wafer can be achieved for asymmetric devices according to the exemplary embodiments of the present invention. In one example, the functional blocks are chiral structures of each other such as those shown in FIGS. 23 to 28. Each of the functional blocks can be a right-handed block or a left-handed block of a similarly shaped block. In one example, the handed or the chiral functional blocks 102 have shapes that allow them to fit next to one another as pieces of a puzzle. In one example, the functional blocks can be formed from a rectangular sheet of starting material wherein the blocks are carved into shapes from this sheet of material without much lost of material. The chiral structure characteristic of these blocks enable them to be closely formed in a nest on the material sheet. The functional blocks are stacked together so as to be space-filling and to most efficiently use the original semiconductor material. FIGS. 23 to 28 illustrate some exemplary layout of the various shapes of the functional blocks 102 that enable efficient use of the starting material sheet or roll. These exemplary layouts tend to mesh or nest together the blocks 102 to create a generally rectangular collection of blocks 102, which collection can then be laid out on a wafer as a conventional rectangular die.

Typically an electronic device requires more than one type of circuit, each performing a different function pertaining to the electronic device. FIGS. 29 to 32 illustrate exemplary electronic device 200 wherein the substrate 104 includes a plurality of receptor sites and a plurality of functional blocks. Each of the receptor sites is configured to receive the matching functional block. As seen, the making of the functional block to the receptor site is achieved by configuring the functional blocks with shape, asymmetric features and key combination according to some of the exemplary embodiments discussed above. The electronic device 200 comprises two different types of functional blocks. In one example, the electronic device 200 comprises functional blocks 102A and 102B (FIG. 29), which are deposited into receptor sites 106A and 106B, respectively. In another example, the electronic device 200 comprises functional blocks 102C and 102D (FIG. 30), which are deposited into receptor sites 106C and 106D, respectively. In another example, the electronic device 200 comprises functional blocks 102E and 102F (FIG. 32), which are deposited into receptor sites 106E and 106F, respectively. In yet example, the electronic device 200 comprises functional blocks 102G and 102H (FIG. 31), which are deposited into receptor sites 106G and 106H, respectively.

FIGS. 29 to 32 further illustrate that at least two different types of functional blocks each of which performing a different function pertaining to the electronic device can be assembled together using the same process and on the same substrate. Further, the two different types of functional blocks can be made out of two different types of starting materials depending on application. The functional blocks can be configured according to some of the exemplary embodiments discussed above. The functional blocks can be chiral structures of one another and can have different shapes from one another. In the example where the functional blocks are chiral structure of one another, the chiral pair functional blocks can have similar shape and similar asymmetric features. The asymmetric features are at opposite locations on the functional blocks. Additionally, the asymmetrical features are also on the opposite location on the blocks. The chiral pair functional blocks are thus mirror images of each other. The receptor sites to mate with the chiral pair functional blocks can have similar shape and keys that are complimentary to the asymmetric features present on the functional blocks of the chiral pair. In one example, the functional blocks configured according to FIGS. 23 to 28 are used to assemble the electronic device 200. In another example, the functional blocks configured according to FIGS. 17 to 22 are used to assemble the electronic device 200. In yet another example, the functional blocks configured according to FIGS. 2 to 7 are used to assemble the electronic device 200. Other shapes and configurations can also be used interchangeable and in combination, for example, blocks having no point of top surface rotational symmetry as shown in FIGS. 12A, 12B and 13.

Figure 33A:
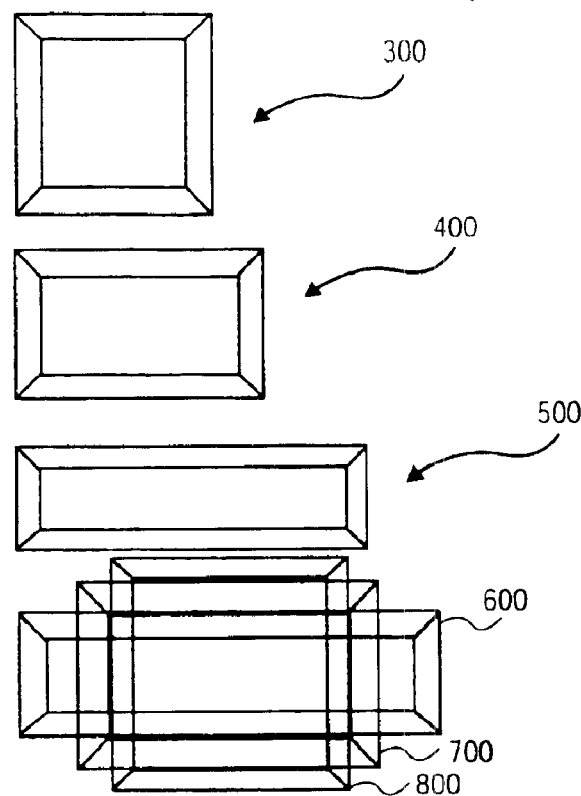
FIGS. 33A–33B illustrates another exemplary functional block shapes that allow two different types of functional blocks to be deposited on the same substrate.
Figure 33B:
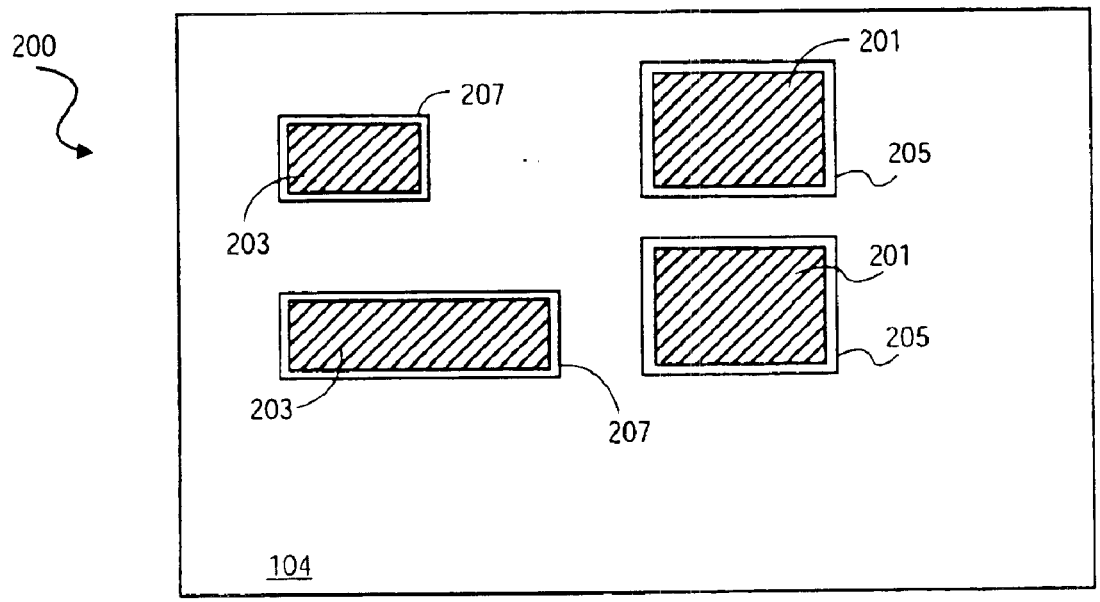

FIGS. 33A and 33B illustrates that in another example, the electronic device 200 may have two different types of functional blocks each having a different shape, for example, one group of functional blocks may be square functional blocks 201 while the other group of the functional blocks may be rectangular functional blocks 203. The electronic device 200 further has appropriate receptor sites matching these differently shaped functional blocks. FIG. 33B, for example, the electronic device 200 will include a group of square receptor sites 205 configured to receive the square functional blocks 201. Additionally, the electronic device 200 will include a group of rectangular receptor sites 207 configured to receive the rectangular functional blocks 203. The functional blocks and their corresponding receptor sites are further sized so as to prevent "cross mating" of the differently shaped functional blocks into the differently shaped receptor sites. (Note that the functional blocks drawn in these figures are drawn with scales only with relative to one another to illustrate the points of size requirement). For example, the square functional blocks are sized so that they do not fall into rectangular receptor sites. As illustrated in FIG. 33A, one functional block has a square shape of a size 300 which will prevent this block from falling into a receptor site configured for another functional block having a rectangular shape of a size 400, and vise versa. Alternatively, the functional block having the square shape having the size 300 or the functional block having the rectangular shape of size 400 will not be able to fall into a receptor site configured for another functional block having a rectangular shape of a size 500. Additionally, the functional block having the shape and size 600, 700, and 800 can be so configured such that none of the functional block will cross-mate with each other's receptor site (e.g., falling into the wrong receptor site). The functional blocks shown in FIGS. 33A and 33B can also include asymmetric feature (notches, tabs, or corners) as discussed above to further ensure proper orientation.

FIG. 37 illustrates an exemplary embodiment of the present invention in which the substrate 104 includes a plurality of receptor sites 106 that are rotated, placed, or pre-oriented at an angle β with respect to the substrate 104. All other aspects of this embodiment are similar to those exemplary embodiments described earlier, for example, the same types of functional blocks 102 with the various types of configurations for the asymmetric features described above can be used for this embodiment. As shown in FIG. 34, typically, the substrate 104 includes the plurality of receptor sites 104 arranged in an array with more than one sides of each of the receptor sites being in parallel with the more than one side of the substrate 104. (See also for example, FIGS. 8, 9, 10, 11, and 13). With additional asymmetric features, as described earlier, the functional blocks 102 may have a "preferred flow orientation" as they are flown in the FSA™ fluid over the substrate 104 to be deposited into the receptor sites 106. The preferred flow orientation of the functional blocks 102 is usually the flow pattern of the blocks as they flow down FSA fluid stream. A group of similarly configured blocks 102 can be tested to allow observation of the preferred flow pattern. Once that is established, the preferred flow orientation of these blocks can be identified. In one example, the preferred flow orientation is at an angle β with respect to the substrate (FIG. 38). The preferred flow orientation may form the angle β with respect to the A-axis, which is parallel to one side of the substrate 104.

As illustrated in FIG. 35, to match the preferred flow orientation of the functional blocks 102, the substrate 104 would have to be rotated at the angle β with respect to the A-axis. In one example, FIG. 36 illustrates that the substrate 106 is kept stationary and not rotated. In this example, the plurality of receptor sites 106 are rotated place, or pre-oriented such that they are at the angle β with respect to the substrate 104 or the A-axis. The receptors sites 106 can be recessed regions created into the substrate 104 using well known method. Alternatively, the receptor sites 106 can be made out of silicon moldings, which are arranged in a pattern that is oriented to the preferred flow orientation of the functional blocks 102.

As mentioned, it has been observed that the functional blocks 102 have a very strong tendency to self-orient in to the preferred flow orientation when moving in a fluid such as a fluid used in the FSA™ process (e.g., water). The shapes, sizes, and configurations of the functional blocks 102 are among the major factors that dictate the preferred flow orientation of the functional blocks 102. For example, when the functional blocks 102 have the configurations such as those described in FIGS. 3, 4, and 6 they tend to move along the flow of the FSA™ fluid with the additional corner being at the further left corner as illustrated in FIG. 38. In FIG. 38, the moving functional blocks 102 have their tab-like extension pointing up. In the direction of the fluid motion (e.g., from top to bottom as shown by the arrow "A," this tab-like extension acts like a tail. In this example, the functional blocks 102 form the β angle with respect to the A-axis or the edge of the substrate 104. The flow in this matter can be referred to as the preferred flow orientation of the functional blocks as they are flown in the FSA™ process. The array of the receptor sites 106 on the substrate 104 is thus rotated (or otherwise pre-oriented or placed or created on the substrate 104) to match the orientation of the preferred flow of the functional blocks 102. The filling of the receptor sites with the FSA™ process is greatly improved by exploiting the tendency of the functional blocks 102 to flow in the preferred flow orientation. The filling efficiency is thus greatly enhanced by pre-orienting (e.g., by rotating) the receptor sites to match the orientation of the moving functional blocks 102 during the FSA filling process.

It is to be expected that other configurations, shapes and sizes of the functional blocks 102 may cause the blocks to flow in a different preferred flow orientation other than the one illustrated in the FIGS. 34 to 38. Thus, the preferred flow orientation for each different type of functional block configuration may be observed and determined. The receptor sites location and orientation on the substrates are then adjusted or placed in the direction to match as closely as possible the preferred flow orientation to increase filling efficiency using the FSA process.

One exemplary method of creating electronic assemblies with asymmetrical functional blocks 102 is described below. In one example, the functional blocks 102 with any of the particular configurations described above are deposited into the substrate 104 described above. The deposition can be performed using a conventional FSA method well known in the art. Each of the functional blocks 102 can perform various functions pertaining to the electronic assemblies or devices. For example, when the electronic device is a monitor display, the functional blocks 102 drive pixel images for the monitor display. As mentioned above, the functional blocks 102 may have at least one asymmetrical point and at least one asymmetric feature.

In one exemplary method, the functional blocks 102 are created using techniques such as those described in U.S. Pat. No. 6,291,896, entitled "Functionally Symmetric Integrated Circuit Die." Alternatively, the functional blocks 102 can be created from a silicon wafer using a standard KOH etching process. The silicon wafer can be silicon on insulator wafer with a predetermined thickness. The functional blocks 102 are first created to have the basic shapes, e.g., a square or a rectangular shaped block. The functional blocks 102 are created to include all the necessary circuit structures (e.g., integrated circuitry components) and standard circuit layouts. The blocks 102 are created so that they are ready to be processed in an existing device fabrication process. When completed, the necessary structures are typically located or situated on the top surfaces of the functional blocks 102. A typical geometry of the functional blocks 102 includes Manhattan Geometry, which consists of all right angle corners. Other suitable geometry can also be used. The functional blocks 102 created under the standard KOH etching technique can typically be in the orders of micrometers.

In another exemplary method, techniques such as laser etching or ion beam etching are used to remove parts of the basic shaped functional block 102 to form the desired configurations for these blocks 102. For example, a laser beam or an ion beam can be used to etch the functional blocks 102 into trapezoidal blocks using standard techniques. As mentioned, the functional blocks 102 may have beveled edges, or partially beveled edges which allows one to distinguish the top and bottom surfaces of the functional blocks 102. One exemplary structure of a beveled edge or partially beveled edge functional block is a trapezoidal structure. Also as mentioned, in another case, the functional blocks 102 have vertical edges. These types of configurations require the functional blocks to have several asymmetric features such as several notches and corners to create the necessary asymmetrical point. For instance, these types of configurations require the functional blocks to be a rectangular shaped block and to have at least one notch to create the necessary asymmetrical point. Alternatively, the functional blocks may have a square shape and three or two notches to create the necessary asymmetrical point. See for example, FIGS. 17 and 22.

Unique asymmetric features are then added to the side, top surface, or corner on the functional blocks 102 such as those described in FIGS. 3 to 7. In one example, additional materials are added to the top surfaces of the functional blocks 102 to create the asymmetric features such as notches/corners to the functional blocks 102. In another example, materials are removed from the functional blocks 102 to create the asymmetric features such as notches/corners to the functional blocks 102. In yet another example, a tab or peninsula are added to the top surfaces of the functional blocks 102 using conventional coupling methods. In this example, this tab or peninsula may be made to contain one type of circuit, which may be physically isolated from other circuitry components that are already present in the functional blocks 102. In one example, the material that is used to couple the tab or the peninsula to the functional blocks 102 may be made out of an insulation material (e.g., insulating and adhesive) which may physically and electrically isolate the circuit on this tab or peninsula from the other integrated circuitry components on the top surface of the functional blocks 102. This is beneficial when there is a need to isolate this particular type of circuit from the other circuitry components on the functional blocks 102. Additionally, the tab feature is useful for radiative and/or electrical isolation purposes. A radiative or electrical isolation helps to further confine any undesirable effects from crossing between these two regions. Further, a charge depletion region created by a power application in one region (e.g., the top surface region), for example would only enter the other region (e.g., the tab or peninsula area) along the narrow edge between them, for example, at the point of connection between the tab and the top surface of the functional block 102.

In another exemplary method, the functional blocks 102 can be created from a piece of starting material such as a silicon wafer using conventional methods. The functional block 102 of this embodiment has a rectangular shape at the top surface of the functional blocks 102. The necessary components such as the integrated circuitry components are created on the top surface of the functional blocks 102. A small amount of materials are then removed from the top surface of the functional blocks to create the asymmetric feature such as a corner area or a notch using a technique such as laser drilling, a final wet etching step, reactive ion etching or ion milling. These techniques are well practiced in the art. An example of such a finished set of functional blocks 102 are illustrated in FIGS. 5, 7, 9, and 11. The only material lost is the material in the "notched" area, and this is drawn to be large in these figures to clearly illustrate the concept. In practice, such a removed area could be fairly small relative to the total surface area of the functional blocks 120.

Figure 39:
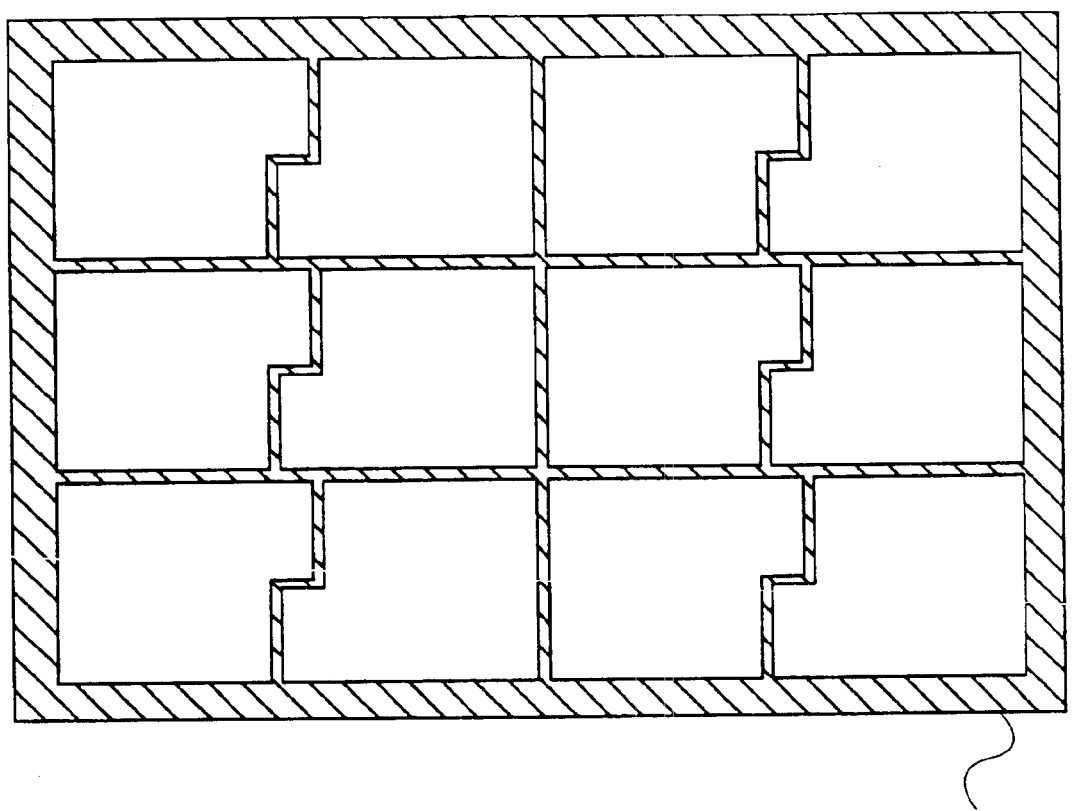
FIG. 39 illustrates an exemplary layout of a mask that can be used to create some of the configurations of the functional blocks with asymmetric features of the present invention.

In another exemplary method, a mask layout is used to define the asymmetric features of the functional blocks 102. The mask layout has features that enable formations of the functional blocks 102 with asymmetrical characteristics or asymmetric features such as additional corners or notches to a four-corner function block 102. For example, to make the functional blocks 102 shown in FIG. 3 or FIG. 4, a mask having a layout 602 shown in FIG. 39 can be used to define the asymmetric shapes of the configurations of these functional blocks 102. It is to be anticipated that the mask layout may have other configurations depending on the sizes and shapes of the functional blocks to be formed. Well know technique such as lithography can be used to etch the functional blocks 102 with a standard KOH silicon etching technique with the mask layout placed over the starting material. After the lithography process, other conventional techniques can be used to create the integrated circuitry components on the functional blocks 102 can be used. These functional blocks can be cleaned and oxidized prior to all assembling process and stored in deionized water when until ready for use.

In another exemplary method, the functional blocks 102 are configured so that they include beveled edges or partially beveled edges. In one example, a specialized mechanical cutting method, such as a vertical saw cut with a variable cutting edge is used to create the partially beveled edges. In another example, the partially beveled edges can be created using a specially formulated and tuned plasma process, such as a fluorine-based, deep reactive ion etching (deep RIE) of silicon and GaAs. This technique is well practiced in the art. One common type of deep RIE silicon etching process (Bosch Process, for example) relies on an alternating passivation and etching steps. If the ratio of these step times are varied at a given set of process conditions, the resulting sidewall angle can be varied from vertical to less than vertical (smaller profile as the etch proceeds into the silicon). This is a controllable method of varying sidewall angles and can be generalized in other etching systems, particularly of the etch feature width decreases with etch depth.

In one exemplary method of forming electronic devices with the functional blocks 102 discussed above, a substrate in a form of a web line is used to form the substrate 104 discussed above. Such substrate allows for easy storage since the substrate can be rolled up prior to and after the assembling process. Further, the substrate can be made out of a flexible material. After mass assembly, the substrate web line can be cut into various sections, each forming any number of electronic devices. In some cases, the substrate can be made out of a silicon wafer, a gallium arsenide wafer, a ceramic material, plastic, glass, silica, or any suitable substrate used in semiconductor or flat panel display field.

As mentioned, the substrate 104 includes a plurality of receptor sites 106 each of which is configured to couple by mating or matchingly coupled to one of the functional blocks 102. The number of the receptor sites 106 on the substrate 104 depends on the application and the number of the units that needed to be formed from the assembling of the functional blocks into the receptor sites. The receptor sites 106 are configured so that they have the keys that match or fit the asymmetric feature on the corresponding functional blocks 102. Additionally, the receptor sites 106 are configured so that they have the complimentary shape and dimensions to receive the functional blocks 102. See for examples FIGS. 8, 9, 10, and 11. The number of the complimentary asymmetric features can vary from at least one to a plurality of the complimentary asymmetric features such that each asymmetric feature on each of the functional blocks 102 has a key to fit the asymmetric feature in order to ensure proper mating of the blocks 102 and the receptor sites 106. See for example, FIGS. 18 to 22.

In one example, the receptor sites 106 can be produced by using techniques such as casting, stamping, embossing, and injection molding, among others. In most case, the receptor sites 106 are recessed regions created into the surface of the substrate 104. However, having receptor sites 106 being recessed is not a limitation of the present invention. If the substrate 104 is made out of an organic material and is an amorphous or semicrystalline polymer, the receptor sites 106 may be embossed into the polymer material with a mold that matches the functional blocks size and pitch for the electronic device being produced. The receptor sites 106 can be molded or carved into a surface, or, be designed as raised areas on the substrate 104. The receptor sites thus contain recesses, protrusions, bulges, or protuberances. Receptor sites with these features can be etched or laser-drilled into the substrate using standard semiconductor processing techniques.

It will be appreciated that embossing is just one method of forming the receptor sites. For example, the coating may alternatively be injection molded onto the substrate during the coating process especially when the substrate is a glass substrate. Alternatively, the receptor sites could be formed in the polymer by solvent casting a polymer solution onto a receptor site mold. The solvent cast sheet could then be laminated or transferred to the glass substrate. Thus, the receptor sites can be a mold formed on top of the substrate, and as such, need not be a recessed region in the substrate.

Materials can be added to each of the receptor sites 106 using conventional methods such as thermoplastic molding or thermoset curing to create the proper asymmetric features. Alternatively, materials can be removed from the receptor sites 106 using conventional etching methods to leave the receptor sites 106 with the appropriate complimentary asymmetric features.

In another example, the receptor sites 104 are configured such that they are partially beveled to complement the partially beveled functional blocks 102 (e.g., FIGS. 14–16) described above. In this process, variable masks are used to produce the final shape. FIGS. 40A–40F illustrate exemplary steps of forming the partially beveled edges receptor sites.

Figure 40A:
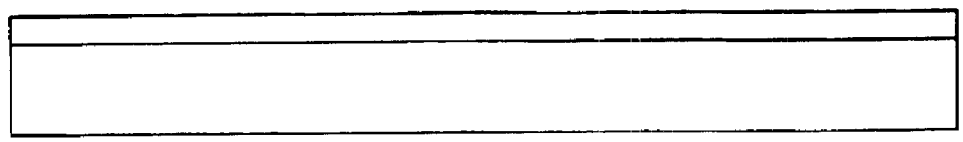
FIGS. 40A–40F illustrate an exemplary process of creating a partially beveled edged receptor site to match the functional blocks having the partially beveled edges such as those illustrated in FIGS. 14 and 15.
Figure 40B:
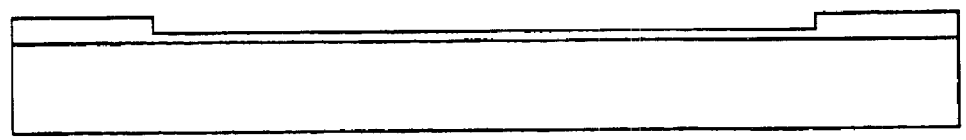
Figure 40C:
Figure 40D:
Figure 40E:
Figure 40F:

FIGS. 40A–F shows a side view of a set of process steps used to make a partially beveled receptor site. FIG. 40A shows a silicon substrate (wafer) with an etch-stop layer on top. This etch stop layer is then thinned (FIG. 40B) or partially removed (FIG. 40C) and the substrate is dry etched so as to make straight (vertical) sidewalls of a specified depth (FIG. 40D). More of the etch stop is removed in a second lithography step (FIG. 40E) on the top surface and then the whole substrate is wet etched in an anisotropic etchant. The resulting partially beveled shape in FIG. 40F is the end result.

In one example, FIG. 14 shows the desired final structure. This shape of device can be formed by a combination of dry and wet etching as well as a mechanical process. In the case of etching, the process involves a patterned etch stop (an oxide/nitride layer is but one example) which is then dry etched to form an opening with straight (vertical) sidewalls between devices. These dry etch procedures typically form sidewall protected layers that could be intentionally thickened if necessary. The bottom of this straight walled would then be lithographically patterned and then stripped of its etch stop and anisotropically etched to form the lower beveled edge.

A mechanical analog of this procedure can be used to form the partially beveled sidewalls or edges. A special dicing blade with a beveled section at the bottom edge can be used which can cut deeper than the beveled blade section. This procedure and several other similar procedures combining beveled and straight dicing blades can also be used to produce the partially beveled devices.

In one exemplary method of forming the electronic assemblies, the functional blocks 102 are deposited into the receptor sites 106 of the substrate 104 such that they are recessed below a surface of the substrate 104. A conventional FSA process can be used to deposit the functional blocks 102 into the receptor sites 106. An exemplary FSA process parameter includes dispensing the functional blocks 102 in a slurry form at a fixed angle over the substrate 104. The slurry is FSA fluid (such as water) and the functional blocks in combination. In one example, vibration at a fixed frequency and amplitude (410 Hz and 3000 nm p-p, respectively) can be used to facilitate the deposition process. The vibration can be applied using a computer-controlled voice coil vibration system that is coupled to the FSA dispensing unit. Preferably, the FSA process is carried out at room temperature (23° C.–26° C.).

In another exemplary method, the receptor sites 106 on the substrate 104 are rotated, pre-oriented, or placed on the substrate to be in the orientation of the preferred flow orientation of the functional blocks as they are being deposited using the FSA process. FIGS. 36 and 37 illustrate that in one case, the functional blocks 102 has a preferred flow orientation that forms a angle $\beta$ with respect to one side of the substrate. In this case, the receptor sites 106 on the substrate are oriented or aligned such that the receptor sites 106 form the angle $\beta$ with respect to the side of the substrate 104. In one example, the receptor sites 106 form a non-parallel direction with at least one side of the substrate as a result of this rotation or orientation of the receptor sites 106 on the substrate 104. The angle $\beta$ varies approximately from 0-degree to 60-degrees with 45-degrees being preferred in many cases. In most cases, the preferred flow orientation of the functional blocks to be deposited are observed. The orientation of most of the blocks when they flow down the stream of the FSA fluid can be recorded using any known and convenient methods such as photography. Once it is determined that most of the blocks in the particular group flow in a particular orientation, the receptor sites on the substrate intended to receive the blocks can then be pre-oriented and placed in a similar direction as the flow orientation of these blocks.

In another exemplary method, the functional blocks 102 not deposited in the receptor sites 106 or not properly or completely deposited in the receptor sites 106 are cleared off the surface of the substrate 104. Clearing is an important part of an FSA process. All of the excess functional blocks 102 need to be removed from the surface of the substrate 104 after the FSA process to permit subsequent planarization and metalization to complete the assembling of the electronic devices. It is of interest to note that the asymmetric features and the additional notches or corners of the functional blocks made the clearing of the excess functional blocks much easier. Clearing can be accomplished either by fluidic or mechanical means. Because of the addition of at least one asymmetric feature and complimentary asymmetric feature combination, the functional block will always protrude slightly from its matched receptor site if it lands in an improper orientation. Such protrusion will facilitate the FSA process in removing improperly deposited blocks to enable proper deposit of other functional blocks in the same fluid thus will improve efficiency for the FSA processing. Moreover, the additional asymmetric feature and complimentary asymmetric feature combination helps a properly seated asymmetrically functional block remains in its matched receptor site during the FSA processing.

In one example, the clearing is achieved by flowing a flow or layer fluid over the surface of the substrate 104 after the flowing of the slurry which deposits the blocks is completed to push off the excess functional blocks. In another example, clearing is achieved by lightly scraping the surface of the substrate 104 with a spatula to remove the excess functional blocks off the surface. There are several other methods of clearing the excess blocks such as light vacuum suction and air blowing.

As mentioned, many applications will require filling a substrate with two (or more) different types of functional blocks. Each of the different types of functional blocks can be made out of a different type of material. For instance, the different types of functional blocks can be selected from blocks comprising Si, SiGe, or GaAs. Examples of different types of functional blocks include a smart card display, which uses a master functional block such as a commercially available NanoBlock™ IC to decode the instructions for the individual slave NanoBlock™ IC's (see, e.g., copending U.S. patent application Ser. No. 09/671,659, filed Sep. 27, 2000, which is hereby incorporated herein by reference), and the Transmit/Receiver (T/R) module which integrates the functional blocks made from 3 different material systems (this T/R module is for use in a radio frequency tag which may be used for product identification). One way to fill the substrate is to perform the fill in two (or more) passes—one for each functional block type. There are disadvantages to filling in two or more passes. First of all, the two different types of functional blocks cannot be the same size. Secondly, even if the sizes of the functional blocks are different, the order in which the two different functional blocks are flowed across the surface must be carefully monitored. For example, the smaller functional blocks should be flowed after the larger functional blocks. Furthermore, if the functional blocks are to be re-used, an additional sorting step will be required.

In one exemplary method, two different types of functional blocks are filled in one pass. In this method, one type of the functional blocks may have a rectangular shape and one type of the functional blocks may have a square shape such as those described in FIG. 33. In this example, the only feature that needs to be controlled is the size of the two different types of the functional blocks. For instance, the dimensions of the rectangular functional blocks have to be chosen carefully enough such that the square functional blocks will not get trapped in the receptor sites for the rectangular functional blocks. Alternatively, the dimensions of the square functional blocks are chosen such that the rectangular functional blocks will not get trapped in the receptor sites for the square functional blocks. One problem associated with filling the substrate with these two different types of functional block may be that the rotational symmetry decreases with a rectangular functional blocks and for a given number of rectangular receptor sites, twice as many rectangular blocks will be required to complete the fill the necessary receptor sites.

In another exemplary method, two different types of functional blocks are filled in one pass wherein each type of the functional blocks is a chiral structure of the other type. The chiral features of the functional blocks is discussed above. Each of the functional blocks includes an additional notch or corner such as those described in FIGS. 23 to 27. As illustrated, each functional block can be a chiral structure of another functional block. Thus, the substrate can be filled with a chiral pair of functional block each of which can be a different type of functional block with different type of circuitry. In one example, the receptor sites can be filled as illustrated in FIGS. 29 to 32. In another example, the top surfaces of the functional blocks of both types are similar to one another. Additionally, the thickness of each of the types of the functional blocks is similar. The only difference is that each functional block type is a chiral structure of the other and each may comprise a different IC component and logic layout. In this example, both of the functional block types can be made at the same size and filled all in one pass. Also, since rotational symmetry is preserved, the amount of blocks required for the filling process will not be higher than normal. Finally, no sorting will be required should the blocks needed to be reused for a FSA filling process.

It will be appreciated that the methods and apparatuses described above can be used to make electronic devices such as flat panel displays for computer monitors, liquid crystal display for notebook type computers, display for cellular phone, and display for digital camera and recorder, and smart cards to name a few.

We claim:

1. A method of making an electronic assembly comprising:
depositing at least one functional block into a substrate having at least one receptor site using a fluidic self-assembly process wherein said receptor site is shaped to receive said functional block
said functional block comprises an integrated circuitry to perform a function pertaining to said electronic assembly, and has at least one asymmetric feature.

2. The method as in claim 1 further comprising
configuring said receptor site to have said at least one key to fit said at least one asymmetric feature.

3. The method as in claim 1 wherein said at least one asymmetric feature is a plurality of asymmetric features and wherein said at least one key is a plurality of keys each of said plurality of keys to fit with one of said plurality of asymmetric features.

4. The method as in claim 1 further comprising:
configuring said functional block to have a top surface, a bottom surface, and beveled edges, said top surface has a dimension that is larger than a dimension of said bottom surface, and said beveled edges are sloped from said top surface to said bottom surface.

5. The method as in claim 4 wherein said asymmetric feature is located at said top surface of said functional block.

6. The method as in claim 4 further comprising coupling a tab to said top surface of said functional block to form said asymmetric feature in said functional block.

7. The method as in claim 1 further comprising:
configuring said functional block to have a top surface, a bottom surface, and partially beveled edges.

8. The method as in claim 4 wherein said at least one asymmetric feature is a plurality of asymmetric features.

9. The method as in claim 4 further comprising:
rotating said receptor site to be at an angle with respect to said substrate to fit a preferred orientation of said functional block during said fluidic self assembly process wherein at least one side of said receptor site is not parallel with at least one side of said substrate.

10. A method of making an electronic assembly comprising:
depositing at least one functional block into a substrate having at least one receptor site to mate with said functional block using a fluidic self-assembly process wherein
said functional block comprises an integrated circuitry to perform a function pertaining to said electronic assembly, said functional block further having a top surface, a bottom surface, a plurality of vertical edges, and at least one asymmetric feature;
wherein when said functional block is mated to said receptor site said top surface faces upward and said bottom surface contacts the bottom of said receptor site; and
wherein said functional block further has a shape that prevents said functional block from mating with said receptor site with said top surface faces downward and contacts the bottom of said receptor site.

11. The method as in claim 10 wherein the shape of the cross section of the block is rectangular.

12. The method as in claim 10 wherein said functional block to has at least two asymmetric features and said receptor site has at least two keys, each of said at least two keys fits at least one of said at least two asymmetric features.

13. The method as in claim 10 wherein said the asymmetric feature is a notch that has a right angle alignment to the rest of the top surface of said functional block.

14. The method as in claim 10 further comprising:
rotating said receptor site to be at an angle with respect to said substrate to fit a preferred orientation of said functional block during said fluidic self assembly process wherein at least one side of said receptor site is not parallel with at least one side of said substrate.

15. A method of making an electronic assembly comprising:
depositing at least one functional block into a substrate having at least one receptor site to mate with said functional block using a fluidic self-assembly process wherein
said functional block comprises an integrated circuitry to perform a function pertaining to said electronic assembly, said functional block further having at least one asymmetrical feature; and wherein
said functional block and said at least one asymmetric feature have shapes to optimize efficient use of a starting material used to fabricate said functional block.

16. The method as in claim 15 further comprising creating said functional block from a starting material wherein said functional block forms a closely packed structure with other functional blocks on said starting material.

17. The method as in claim 15 wherein said receptor site comprises at least one key said at least one key to fit said at least one asymmetric feature.

18. The method as in claim 15 wherein said at least one asymmetric feature is a plurality of asymmetric features and wherein said at least one key is a plurality of keys each of said plurality of keys to fit with one of said plurality of notches.

19. The method as in claim 15 wherein said functional block has a top surface, a bottom surface, and beveled edges, said top surface has a dimension that is larger than a dimension of said bottom surface, and said beveled edges are sloped from said top surface to said bottom surface.

20. The method as in claim 19 wherein said asymmetric feature is located at said top surface of said functional block.

21. The method as in claim 19 further comprises coupling a tab to said top surface of said functional block to form said asymmetric feature in said functional block.

22. The method as in claim 15 further comprising:
rotating said receptor site to be at an angle with respect to said substrate to fit a preferred orientation of said functional block during said fluidic self assembly process wherein at least one side of said receptor site is not parallel with at least one side of said substrate.

23. A method of making electronic assembly comprising:
depositing a functional block into a substrate having a receptor site to mate with said functional block using a fluidic self-assembly process wherein
said functional block comprises an integrated circuitry to perform a function pertaining to said electronic assembly, said functional block further comprises at least two asymmetric features that are arranged on the functional block such that there is at least one top surface rotational symmetry; and
wherein said functional block is further a chiral structure of another functional block having another integrated circuitry, said at least two asymmetric features, and said at least one top surface rotational symmetry.

24. The method as in claim 23 wherein said functional block and said at least two asymmetric features have shapes to optimize efficient use of a starting material used to fabricate said functional block.

25. A method of making an electronic assembly comprising:
depositing a plurality of functional blocks into a substrate having a plurality of receptor sites to mate with said plurality of functional blocks using a fluidic self-assembly process wherein
each of said plurality of functional blocks comprises an integrated circuitry to perform a function pertaining to said electronic assembly,
wherein said plurality of functional blocks includes at least two different types of functional blocks, each of which is used to perform a different function pertaining to said electronic assembly;
wherein each of said plurality of functional blocks has at least one asymmetric feature, and
wherein each of said plurality of receptor sites mates with one of said plurality of functional blocks.

26. The method as in claim 25 wherein each of said plurality of receptor sites includes at least one key to fit with said at least one asymmetric feature.

27. The method as in claim 26 wherein each of said functional block has a top surface, a bottom surface, a plurality of vertical edges,
each of said receptor sites mates with said each functional block using said fluidic self-assembly process;
each functional block is mated to said each receptor site with said top surface faces upward and said bottom surface contacts the bottom of said receptor site;
each of said plurality of functional block has a shape that prevents said each of said plurality of functional blocks from mating with each of said receptor sites with said top surface facing downward and contacting the bottom of said receptor site; and
each of said at least two different types of functional blocks has a different shape compared to one another.

28. The method as in claim 26 wherein at least two types of said plurality of functional blocks are made from a different material from one another.

29. The method as in claim 26 wherein said plurality of functional blocks include at least two differently shaped functional blocks and wherein said plurality of receptor sites include at least two differently shaped receptor sites matching said at least two differently shaped functional blocks.

30. The method as in claim 26 wherein said plurality of functional blocks and said plurality of receptor sites are sized to prevent cross mating of differently shaped functional blocks into differently shaped receptor sites.

31. The method as in claim 27 further comprising:
rotating said plurality of receptor sites to be at an angle with respect to said substrate to fit a preferred orientation of said plurality of functional blocks during said fluidic self assembly process wherein at least one side of each of said plurality of receptor sites is not parallel with said substrate.

32. A method of making an electronic assembly comprising:
depositing a plurality of functional blocks into a substrate having a plurality of receptor sites to mate with said plurality of functional blocks using a fluidic self-assembly process wherein
each of said plurality of functional blocks comprises an integrated circuitry to perform a function pertaining to said electronic assembly,
wherein at least one type of function block has a square shape and at least another type of function block has a rectangular shape,
wherein said plurality of receptor sites includes at least a square type of receptor site and at least a rectangular type of receptor site,
wherein said at least one type of function block that has said square shape is only complementary to said square type of receptor site, and
wherein said at least another type of function block that has said rectangular shape is only complementary to said rectangular type of receptor site.

33. The method as in claim 32 wherein said at least one type of functional block that has said square shape is sized to prevent said at least one type of functional block that has said square shape from mating with said rectangular type of receptor site and wherein said at least another type of functional block that has said rectangular shape is sized to prevent said at least another type of functional block from mating with said square type of receptor site.

* * * * *